(12) United States Patent
Wang et al.

(10) Patent No.: US 12,272,921 B2
(45) Date of Patent: Apr. 8, 2025

(54) METHODS TO APPLY MICROLENS ON SMALL APERTURE PHOTODETECTORS AND VCSEL FOR HIGH DATA RATE

(71) Applicant: Broadcom International Pte. Ltd., Singapore (SG)

(72) Inventors: Tak Kui Wang, San Jose, CA (US); Rashit Nabiev, San Jose, CA (US); Ramana M. V. Murty, San Jose, CA (US); Laura M. Giovane, San Jose, CA (US)

(73) Assignee: Broadcom International Pte. Ltd., Singapore (SG)

( * ) Notice: Subject to any disclaimer, the term of this patent is extended or adjusted under 35 U.S.C. 154(b) by 476 days.

(21) Appl. No.: 17/509,596

(22) Filed: Oct. 25, 2021

(65) Prior Publication Data

US 2022/0209496 A1    Jun. 30, 2022

Related U.S. Application Data

(60) Provisional application No. 63/132,711, filed on Dec. 31, 2020.

(51) Int. Cl.
| | | |
|---|---|---|
| *H01S 5/02326* | (2021.01) | |
| *H01L 31/0232* | (2014.01) | |
| *H01L 31/18* | (2006.01) | |
| *H01S 5/02253* | (2021.01) | |
| *H01S 5/0234* | (2021.01) | |

(Continued)

(52) U.S. Cl.
CPC .... *H01S 5/02326* (2021.01); *H01L 31/02327* (2013.01); *H01L 31/186* (2013.01); *H01S 5/02253* (2021.01); *H01S 5/0234* (2021.01); *H01S 5/0239* (2021.01); *H01S 5/183* (2013.01)

(58) Field of Classification Search
CPC .. H01S 5/02326; H01S 5/183; H01S 5/02253; H01S 5/0239; H01S 5/0234; H01L 31/02327
See application file for complete search history.

(56) References Cited

U.S. PATENT DOCUMENTS

| | | |
|---|---|---|
| 4,867,371 A | 9/1989 | Davis et al. |
| 2009/0226130 A1* | 9/2009 | Doany ................. G02B 6/4246 385/14 |

(Continued)

FOREIGN PATENT DOCUMENTS

JP    2011-175008 A    9/2011

OTHER PUBLICATIONS

DE Office Action on DE appln 102021127971.2 dated May 12, 2022.

*Primary Examiner* — Nduka E Ojeh
(74) *Attorney, Agent, or Firm* — Foley & Lardner LLP

(57) ABSTRACT

Data rate that can be supported by a photodetector can be limited by the aperture size of the photodetector. In some embodiments, the minimum aperture diameter can be about 30 um. This limitation is due, for example, to an inability of the optics to focus the beam to a smaller spot, and the mechanical tolerances of the assembly process. The techniques described in the present disclosure can reduce the optical spot size and improve on the mechanical tolerances that are achievable, thereby improving the photodetector and VCSEL manufacturing processes and systems. A photodetector or VCSEL system design with higher data rate and lower production cost can be achieved using the techniques described herein.

24 Claims, 21 Drawing Sheets

(51) Int. Cl.
*H01S 5/0239* (2021.01)
*H01S 5/183* (2006.01)

(56) References Cited

U.S. PATENT DOCUMENTS

| | | | | |
|---|---|---|---|---|
| 2011/0044369 | A1* | 2/2011 | Andry | G02B 6/4257 |
| | | | | 257/E31.127 |
| 2012/0001166 | A1* | 1/2012 | Doany | H01L 27/04 |
| | | | | 257/E31.127 |
| 2012/0051685 | A1* | 3/2012 | Su | H01S 5/423 |
| | | | | 385/14 |
| 2013/0266326 | A1* | 10/2013 | Joseph | H04B 10/1141 |
| | | | | 398/130 |
| 2016/0204575 | A1* | 7/2016 | Horn | H01S 5/0237 |
| | | | | 372/36 |
| 2017/0097480 | A1* | 4/2017 | Wang | G02B 6/4204 |
| 2017/0213785 | A1* | 7/2017 | Kumbhat | H01L 21/4867 |

* cited by examiner

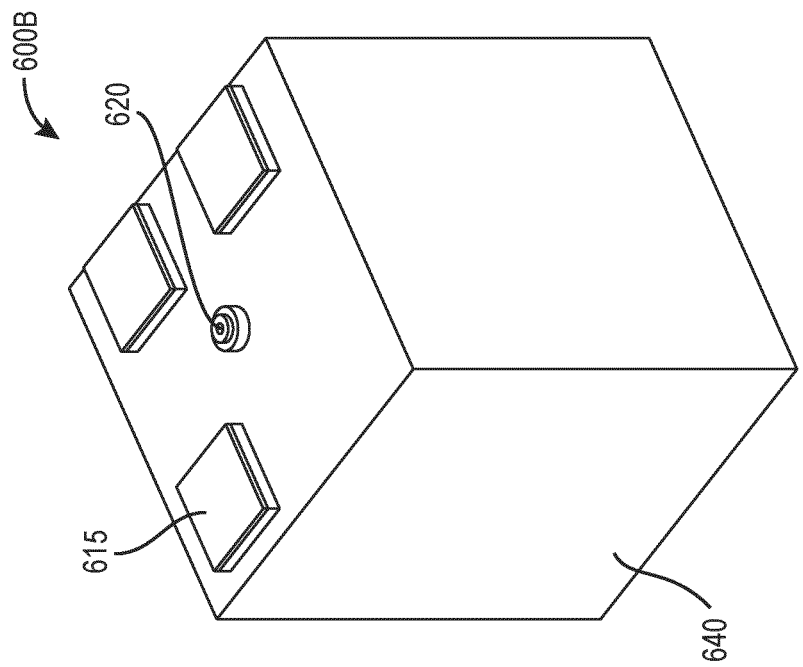
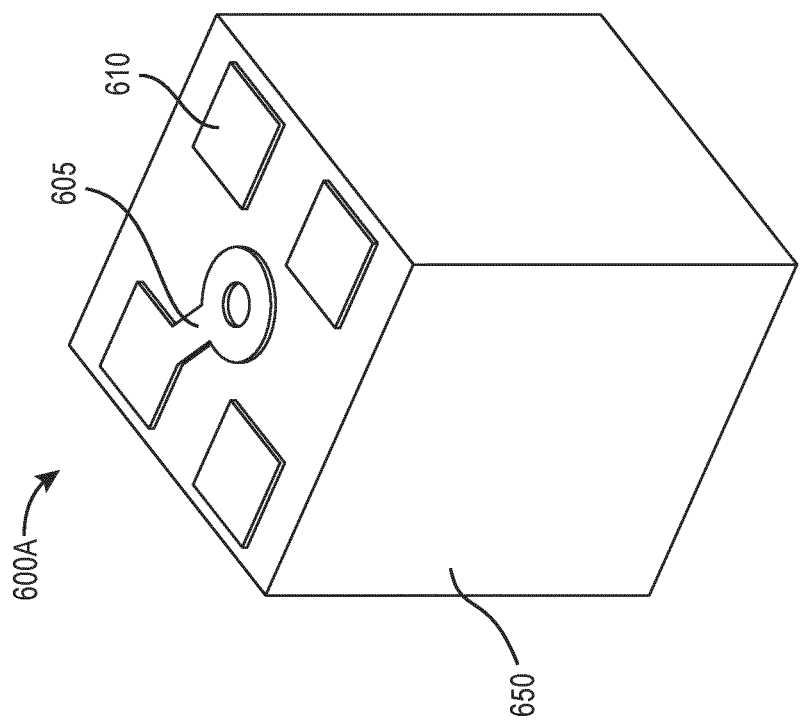

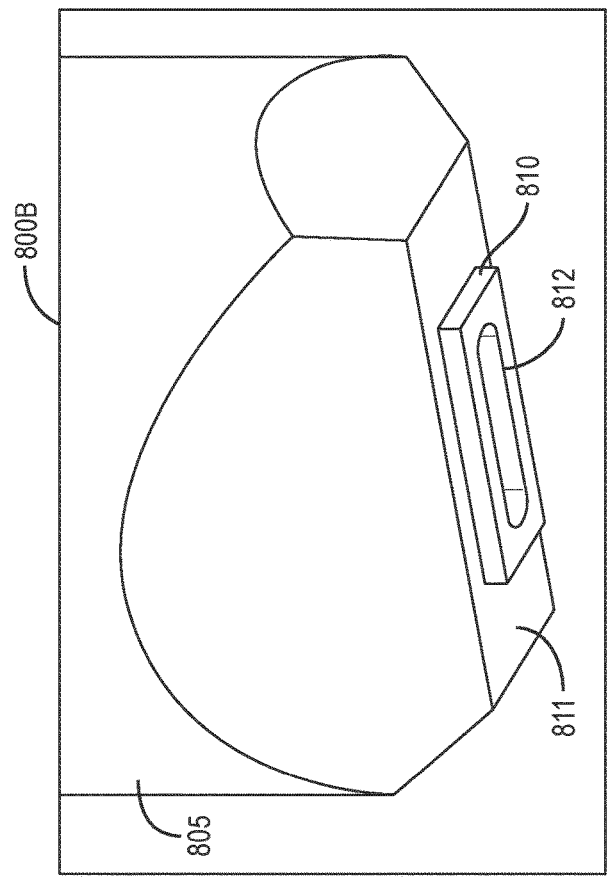
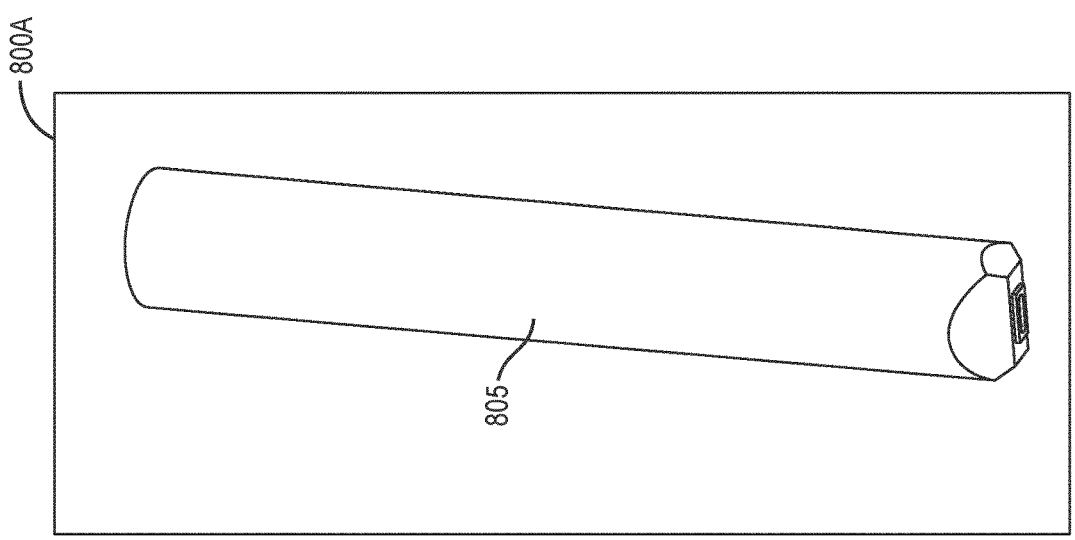
FIG. 8B
FIG. 8A

METHODS TO APPLY MICROLENS ON SMALL APERTURE PHOTODETECTORS AND VCSEL FOR HIGH DATA RATE

CROSS REFERENCE TO RELATED APPLICATIONS

The present application claims the benefit of and priority to U.S. Application Ser. No. 63/132,711, filed Dec. 31, 2020 and assigned to the assignee of the present application, incorporated herein by reference in its entirety.

FIELD OF THE DISCLOSURE

This disclosure generally relates to systems and methods for applying a lens (e.g., a microlens) to a photodetector (e.g., a PIN photodiode, etc.) and a light emitter (e.g., a VCSEL, LED, etc.). Some embodiments in this disclosure relate to systems and methods for bonding a wafer with light receiving or emitting devices to a lens wafer.

BACKGROUND OF THE DISCLOSURE

Data rate that can be supported by a photodetector is limited by the aperture size. It can be challenging to minimize the aperture size of a photodetector because of a limited ability of the optics to focus the beam to a smaller spot, and because of mechanical tolerances of the assembly process.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

FIGS. 6A, 6B, 6C, 6D, 6E, 6F, and 6G are schematic perspective view drawings showing example process flow for coupling a non-hermetic VCSEL to a microlens, in accordance with one or more embodiments;

FIGS. 8A and 8B are schematic perspective view drawings of an example pick and place tool for the devices described herein, in accordance with one or more embodiments.

Figure 1A:
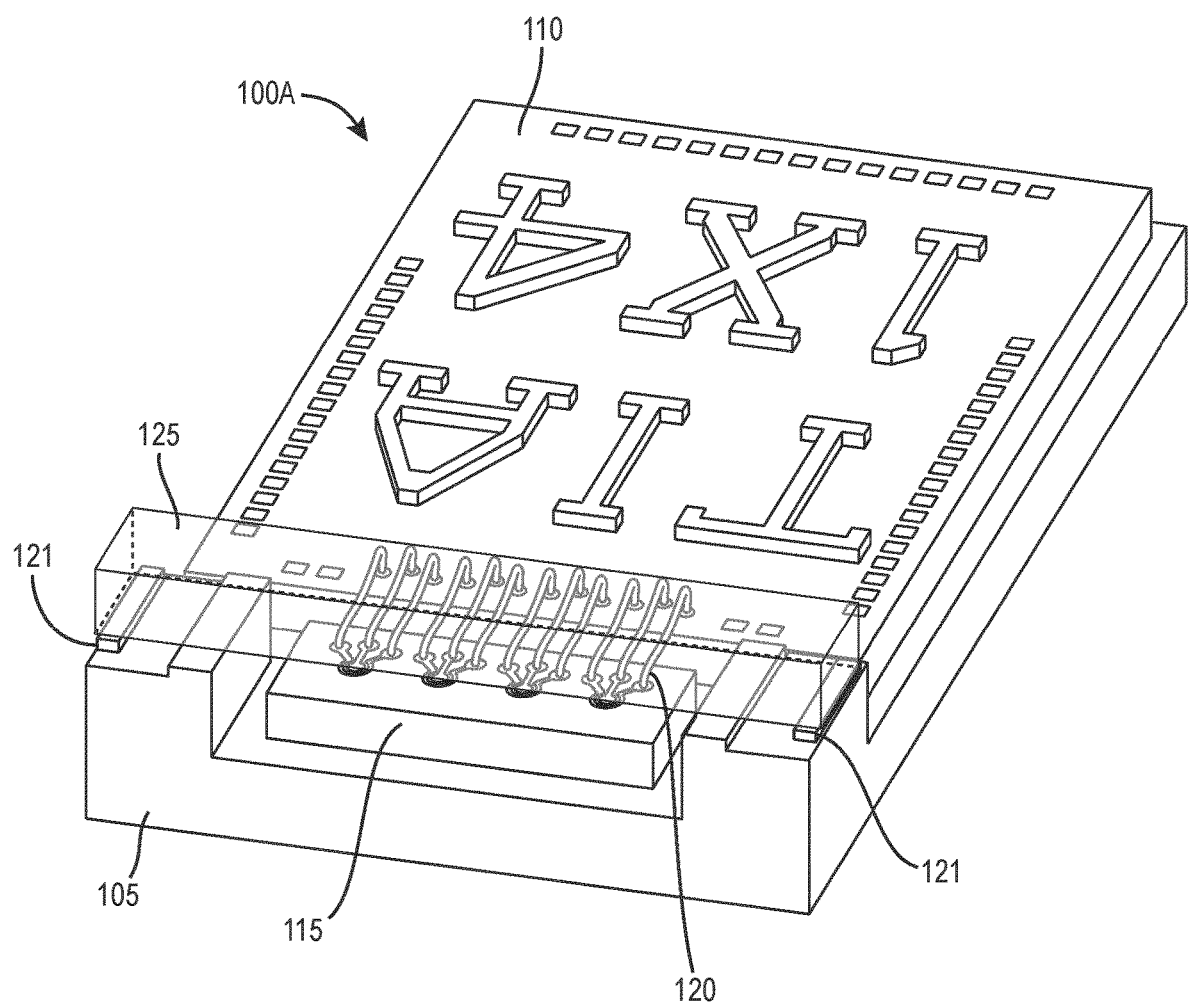
FIGS. 1A and 1B are schematic perspective view drawings of systems that include a discrete lens and a photodetector mounted on a carrier, complete with wire bond from the photodetector to a transimpedance amplifier (TIA), in accordance with one or more implementations.

The details of various embodiments of the methods and systems are set forth in the accompanying drawings and the description below.

DETAILED DESCRIPTION

Below are detailed descriptions of various concepts related to, and embodiments of, techniques, approaches, methods, apparatuses, and systems for photodetectors and lasers including but not limited to systems and methods for applying a microlens to a small aperture photodetector (e.g., a positive-intrinsic-negative (PIN) photodetector, etc.) and a light source (e.g., a vertical cavity surface emitting laser (VCSEL)). Some systems and methods are related to bonding a PIN or VCSEL wafer to a lens wafer. The lens can be a high magnification lens. The devices can be a back illuminated surface mountable PIN integrated with a lens that can operate at 850 nanometer wavelength or a back illuminating surface mountable VCSEL integrated with a lens that can operate at 850 nanometer wavelength. The various concepts introduced above and discussed in detail below can be implemented in any of numerous ways, as the described concepts are not limited to any particular manner of implementation. Examples of specific embodiments and applications are provided primarily for illustrative purposes.

Data rates that can be supported by a PIN detector can be limited by the aperture size of the PIN detector. In some embodiments, the minimum aperture diameter can be about 30 um. This limitation is due, for example, to the ability of the optics to focus the beam to a smaller spot, and the mechanical tolerances of the assembly process. The techniques described in the present disclosure can reduce the optical spot size and improve on the mechanical tolerances that are achievable, thereby improving conventional PIN and VCSEL performance, manufacturing processes and systems. A design with higher data rate and lower production cost can be achieved using the techniques described herein.

The systems and methods described herein provide a method for applying a microlens to a small aperture PIN detector device, or a VCSEL device, for high data rate applications. The techniques described herein can use a wafer to wafer bonding method to bond a PIN or VCSEL wafer to a lens wafer. The substrate of the PIN or VCSEL wafer can be subsequently removed. The remaining epi-structure can be supported by the lens wafer. Electrical connections can be made through the epi-structure, from the back side of the device.

For a PIN application, a lens wafer with high refractive index can be used to focus the beam into a smaller spot size. Tolerances in optical distance between the lens and the aperture due to the lens wafer thickness can be reduced due to the high refractive index of the lens wafer. For a VCSEL application, the lens wafer could have a smaller refractive index.

In some embodiments, a PIN chip (e.g., wafer, substrate, etc.) can be placed onto a substrate. The front surface or aperture of the PIN chip can be referenced to the face of a mechanical structure that is in the same direction of the aperture. A lens facing the aperture of the PIN can be placed onto the reference surface of the mechanical structure. This technique can reduce the tolerance between the surface of the aperture and the lens. Further details of these and other techniques are described herein.

For example, these techniques can be modified to provide different variations of devices and configurations, which may be suitable for certain applications. Different lens materials can be used for the lens wafer, such as silicon carbide (SiC) or gallium phosphide (GaP), among others (e.g., some glass materials). In some embodiments, the lens material has high thermal conductivity (e.g., for VCSEL), high refractive index (e.g., for PIN), thermal coefficient expansion compatible with semiconductor, and transparent at the wavelength of interest. In some embodiments, different electrical connections, such as gold stud bumps and thermal compression bonds, or solder bumping, can be implemented in conjunction with the techniques described herein. In some embodiments, the lens wafer can be bonded onto a PIN wafer or a VCSEL wafer using a thermal compression bonding process, an epoxy bonding process, a solder bonding process, or a thermosonic bonding process, among others.

Some techniques described herein provide various improvements over conventional PIN and VCSEL devices and manufacturing processes. For example, the techniques described herein can be used in an 850 nm PIN implementation, which is impossible using conventional techniques. Further, the techniques described herein can reduce the capacitance of a PIN detector. Reducing the capacitance can greatly increase the bandwidth of the detector system. A wafer level lens to aperture alignment can reduce costs of alignment. Furthermore, decreased capacitance can reduce noise for the TIA, thus improving sensitivity or detection limit. The design can be surface mountable, which can ease the assembly process while improving signal integrity.

In some embodiments, thermosonic bonding can be used to attach to the device to the TIA and the lens to the device. In some embodiments, flip chip techniques can be used to mount the TIA and devices to a circuit board. In some embodiments, epoxy is applied at specific designed location to attach the device to the lens, thereby avoiding drift associated with curing the epoxy.

Figure 1B:
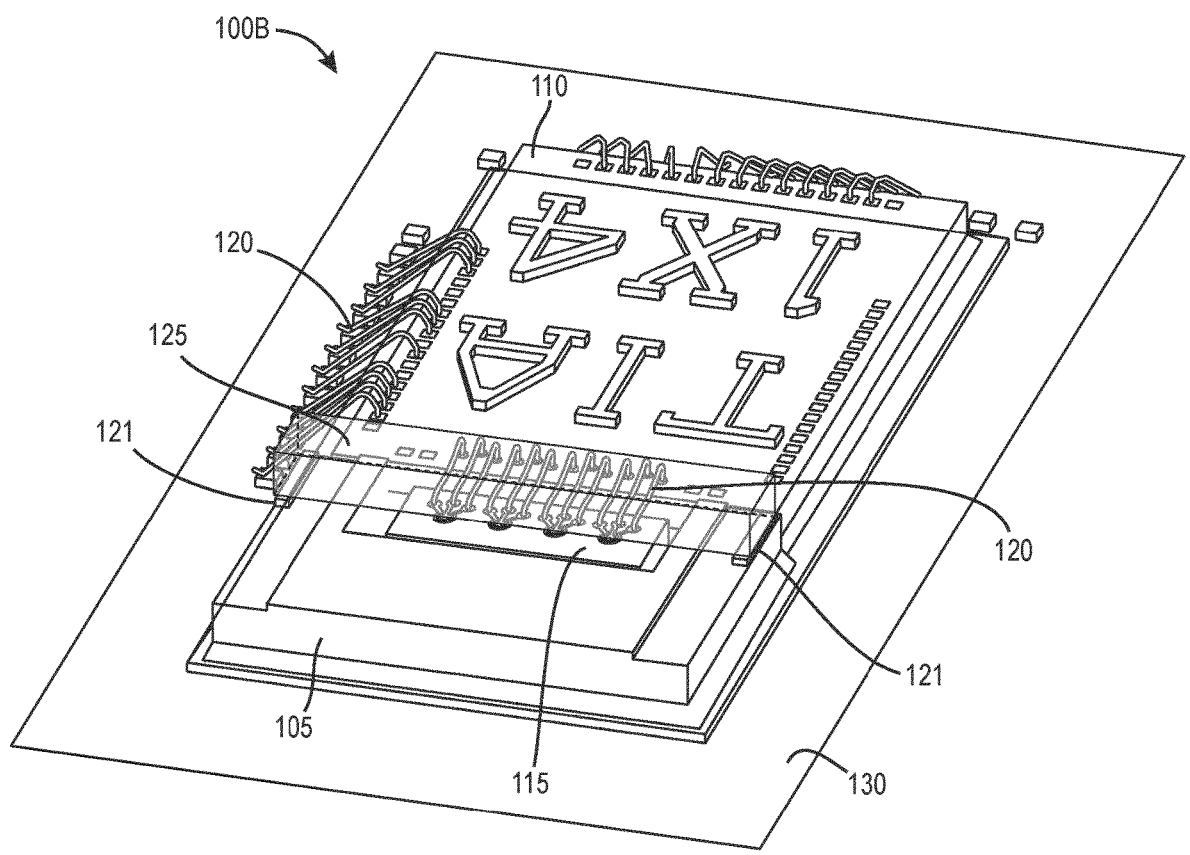

The device with lens integration can be connected to the TIA or driver IC, similar to an arrangement depicted in FIGS. 1A and 1B. In some embodiments, the lens material can have a much higher conductivity (e.g. SiC thermal conductivity can be over 400 W/meter-Kelvin (mK), etc.). Having higher conductivity can lower the overall temperature of VCSEL devices. In the discrete lens application, the techniques described herein can minimize tolerance of the distance between the lens and the aperture. As the spot size is minimized, the numerical aperture (NA) of the beam approaching the aperture can become high. A precise aperture to lens distance can maintain the small spot size, which is an improvement over conventional techniques.

Some embodiments relate to a method of applying a lens to an optical device. The method includes aligning first metal pads of a lens substrate with second metal pads of an optical device substrate having a first surface comprising at least a portion of one or more optical devices. The method also includes coupling the first metal pads of the lens substrate with the second metal pads on the first surface of the optical device substrate. The method includes removing a portion of the optical device substrate to expose a conductive layer, the conductive layer being on a second surface opposite the first surface after removing the portion.

Some embodiments relate to an apparatus. The apparatus includes a lens with a first lens surface and a second lens surface opposite the first lens surface. The second lens surface comprising a first metal pad. The apparatus also includes a device layer with an optical device, a first device surface and a second device surface opposite the first device surface. The first device surface includes a second metal pad, and the second device surface includes a third metal pad. The second metal pad is physically attached to the first metal pad, and the third metal pad is configured for attachment to a circuit board.

Some embodiments relate to a method of fabricating an optical device. The method includes attaching a lens substrate to an optical device substrate having a first surface comprising at least a portion of one or more optical devices. The first surface is in contact with a second surface of the lens substrate. The method also includes removing a portion of the optical device substrate to expose a conductive layer. The conductive layer is on a third surface of the optical device substrate opposite the first surface of the optical device substrate after removing the portion.

Some embodiments relate to an optical device assembly. The optical device assembly includes a carrier, a discrete lens attached to the carrier between a plurality of raised portions extending from a first surface of the carrier, and a semiconductor material. The semiconductor includes a top surface including at least a portion of an optical device and a bottom surface. The semiconductor material being attached to the first surface at the bottom surface.

In some embodiments, the optical device substrate comprises an epitaxial layer above an etch stop layer above a bulk substrate and wherein removing the portion comprises etching to the etch stop layer, the etch stop layer being adjacent the conductive layer.

Referring now to FIG. 1A, depicted is a perspective view 100A of a system that includes a discrete microlens and a photodetector mounted on a carrier, complete with wire bond from the photodetector to a transimpedance amplifier (TIA), in accordance with one or more embodiments. The system depicted in view 100A can include a carrier 105, a TIA 110, a photodetector 115, wire connections 120, and a lens 125 (e.g., a microlens).

The carrier 105 can be any type of carrier that is capable of coupling to the TIA 110 and the photodetector 115. For example, the carrier can be formed from a metal substrate, an epoxy substrate, a silicon substrate, a plastic substrate, or any other type of substrate that can be coupled to the TIA 110 and the photodetector 115. In some embodiments, the carrier 105 can be formed from a machining process, an injection molding process, a photolithographic manufacturing process, an additive manufacturing process (e.g., three-dimensional (3D) printing, etc.), among others. The carrier 105 can be coupled to at least one detectors 115, at least one lens 125, and at least one TIA 110.

The photodetector 115 can include a PIN diode, which can be used to detect certain wavelengths of light that pass through the lens 125. The photodetector 115 can have a wide, undoped intrinsic semiconductor region between a p-type semiconductor and an n-type semiconductor region. In some embodiments, some region of the p-type and n-type can be heavily doped because they are used for ohmic contacts. In some embodiments, the detector 115 can be reverse-biased. Under reverse bias, the diode ordinarily may not conduct. When a photon of sufficient energy (e.g., having a certain frequency or wavelength, etc.) enters the depletion region of the diode, it can create an electron-hole pair. The reverse-bias field sweeps the carriers out of the region, creating current. In some embodiments, the photodetector 115 can use avalanche multiplication. The photodetector 115 can be used in high-speed fiber-optical communications systems. The photodetector 115 can be a PIN or avalanche detector.

The photodetector 115 can include one or more PIN diodes. In some embodiments, the photodetector 115 can be electrically coupled to a TIA 110 via one or more bonding wires 120. The bonding wires 120 can be small wires that have a low resistance, such as a gold wire, a platinum wire, or a silver wire. The bonding wires 120 can be coupled to the photodetector 115 and to the TIA using a thermal compression bonding process, an epoxy bonding process, a solder bonding process, or a thermosonic bonding process, among others.

The TIA 110 can be electrically coupled to the photodetector 115, and can amplify signals received form the photodetector 115. In some embodiments, the current provided by the photodetector 115 in response to light signals can be small. The TIA 110 can detect and amplify the signals from the photodetectors 115, such that the signals can be detected by other, less-sensitive communications components. In some embodiments, the TIA 110 can be a current to voltage converter, and can include one or more operational amplifies. The TIA 110 can be manufactured, for example, using one or more photolithographic techniques. In some embodiments, the TIA 110 can be a separate module that is coupled to the carrier 105, and electrically coupled to the photodetectors 115 using the bonding wires 120. The output of the TIA 110 can be electrically coupled to one of or more other electrical components, such as signal processing components (not pictured).

The lens 125 can be coupled to the carrier 105 over the photodetector 115 or more than one photodetector 115, and can focus light onto the photodetector 115 or more than one photodetector 115 to aid in the detection of light. The lens 125 can be manufactured from one or more materials, such as silicon carbide (SiC) or gallium phosphide (GaP), among others. The lens 125 can be manufactured as part of a lens wafer (e.g., with many other lens 125, etc.), and subsequently cut, etched, or otherwise divided to suit the size requirements of a particular application. In some embodiments, the lens 125 can be bonded onto the photodetector 115 using a thermal compression bonding process, an epoxy bonding process, a solder bonding process, or a thermosonic bonding process, among others. In some embodiments, there is a separation gap between the lens 125 and the photodetector 115, and the lens 125 can be bonded onto the carrier using a thermal compression bonding process, an epoxy bonding process, a solder bonding process, or a thermosonic bonding process, among others.

Referring to FIG. 1B, depicted is an example view 100B that includes a device similar to that shown in FIG. 1A, but mounted on a printed circuit board (PCB). The system in view 100B can include a carrier 105, a TIA 110, a photodetector 115, wire connections 120, a lens 125 (e.g., microlens), and a PCB 130. As shown, the system in view 100B is similar to the system in view 100A depicted in FIG. 1A, but with additional bonding wires 120 that electrically couple the TIA 110 to the PCB 130. In some embodiments, the photodetector 115 can be coupled directly with a lens to form a photodetector assembly, and the photodetector assembly can be coupled directly to the TIA 110. Similar to an arrangement in FIG. 1B, in some embodiments, the TIA 110 can be coupled directly to the surface of the PCB 130.

The PCB 130 can include one or more conductive pads or traces that electrically couple electronic components to one another. In some embodiments, the bonding wires 120 can be coupled to the TIA 110 and the PCB 130 using a thermal compression bonding process, an epoxy bonding process, a solder bonding process, or a thermosonic bonding process, among others. In some embodiments, the carrier 105 of the system in view 100B can be bonded onto one or more conductive pads on the PCB 130, for example, a ground plane, or another type of pad (e.g., a pad coupled to another electric signal or voltage rail, or a floating pad, etc.). Similar to an arrangement in FIG. 1B, in some embodiments, the TIA 110 can be coupled directly to the surface of the PCB 130. For example, in some embodiments, the conductive pads of the TIA 110 can be directly coupled with conductive pads exposed on the photodetector 115 assembly (or a VCSEL assembly, as described herein, etc.) to form a TIA 110 assembly. The TIA 110 assembly can then be bonded to the PCB 130 using one or more bonding processes described herein, which in some embodiments, can include one or more of the bonding wires 120.

In some embodiments, the lens 125 is seated directly on the carrier 105. The epoxy 121 is disposed between the lens 125 and carrier 105. This arrangement with epoxy 121 between the lens 125 and the carrier 105 has a tolerance in thickness which translate into an unknown distance between the lens 125 and the photodetector 115. In this arrangement, the lens 125 is pushed down to the carrier 105. When the epoxy 121 cures, the epoxy 121 shrinks to keep the lens surface on the carrier 105 after cure. Hence, the position of the lens 125 is controlled with respect to the carrier 105. Placement of the photodetector 115 is placed with utilizing the tool techniques described with reference to FIG. 8 below in some embodiments. The tool technique uses the top surface of the carrier 105 as a reference for the top surface of the photodetector 115 in some embodiments. Gold stud bumps are disposed at the bottom of the carrier 105. When the tool technique pushes the photodetector 115 down, the gold stud bumps deform. When the die attach epoxy cures, the gold stud bumps keep the position of the bottom of the photodetector 115, which means the top position of the photodetector 115 is maintained.

Figure 2A:
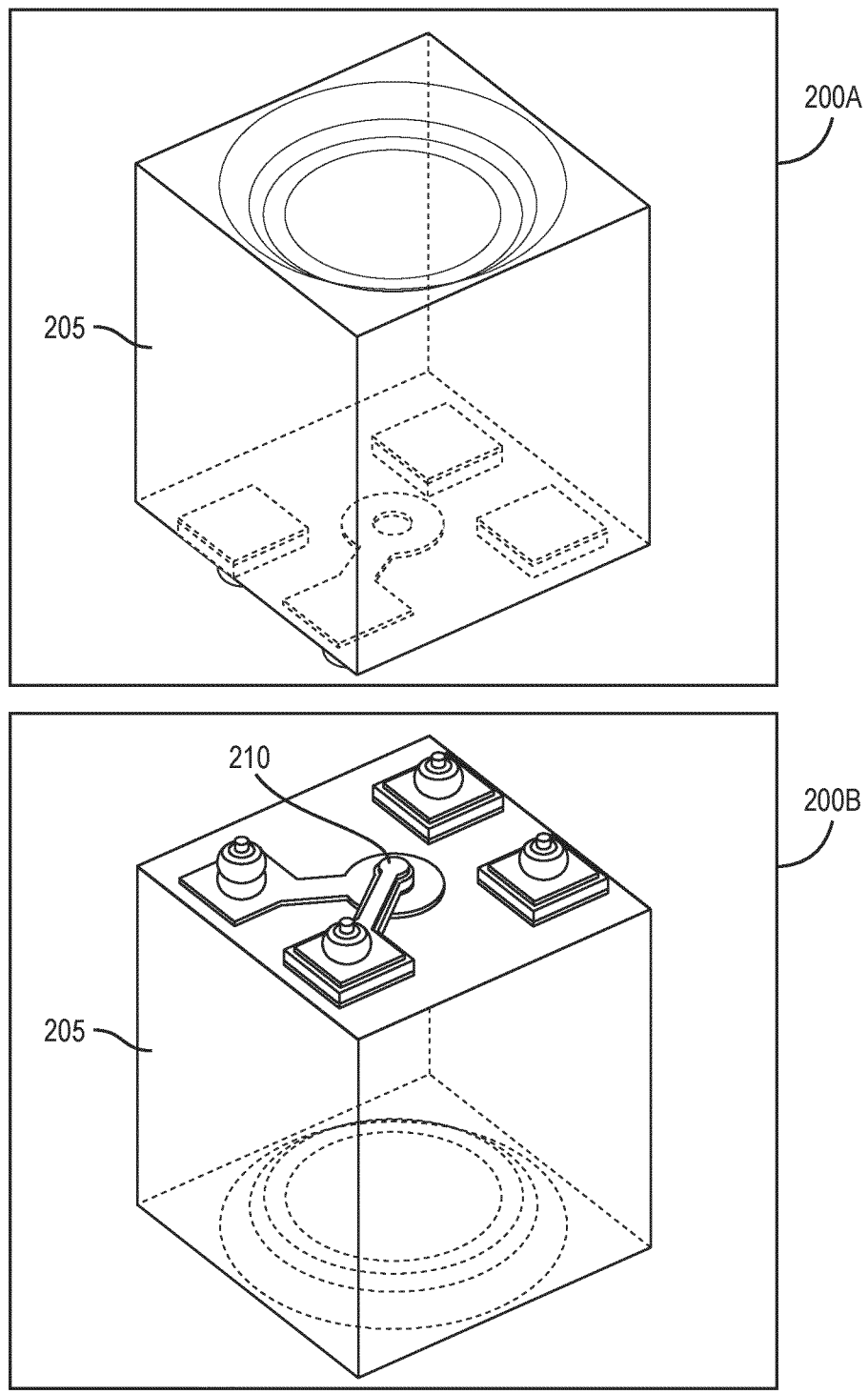
FIGS. 2A and 2B schematic perspective view drawings of a non-hermetic mesa VCSEL and a hermetic mesa VCSEL, respectively, in accordance with one or more implementations.
Figure 2B:
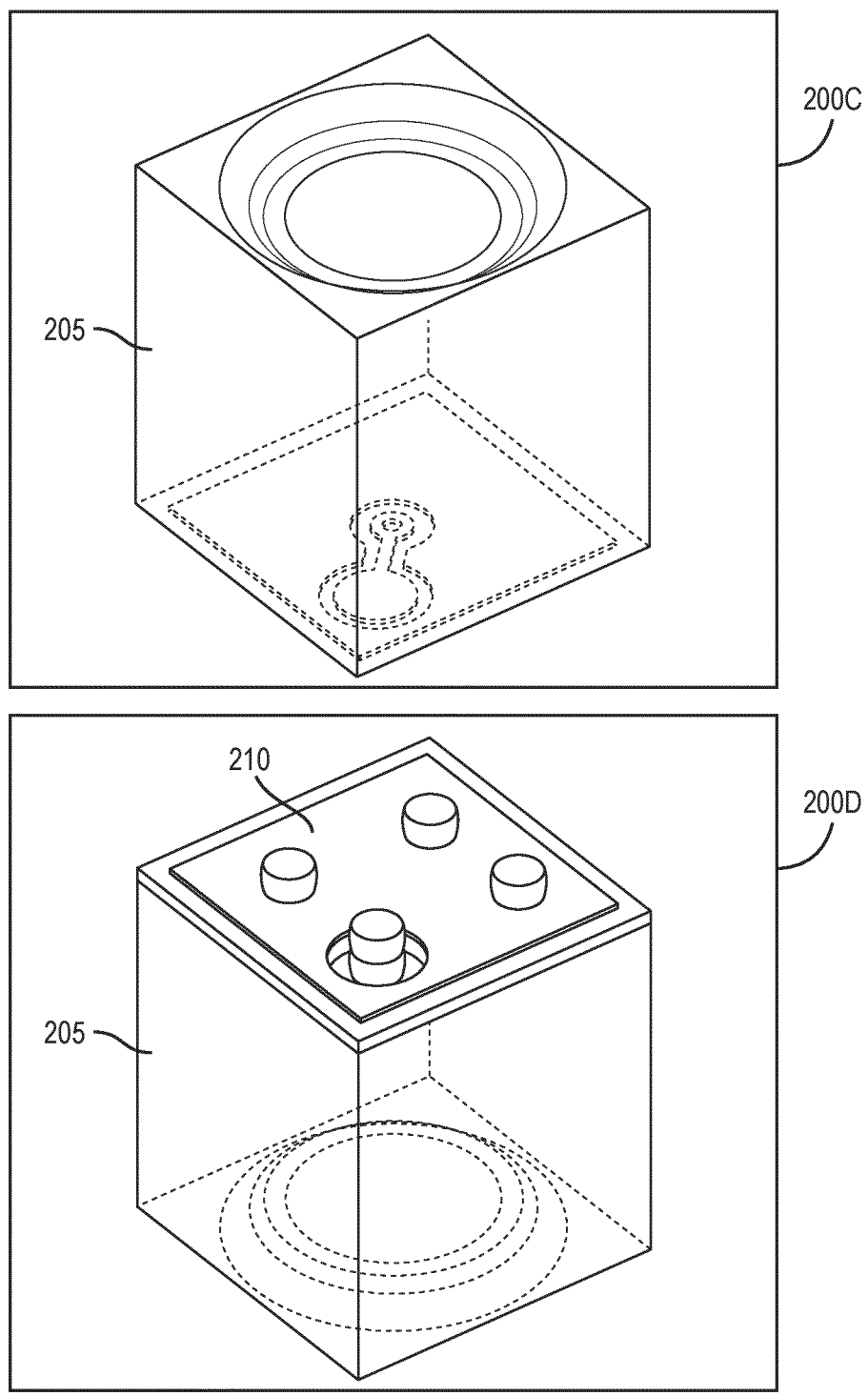

Referring now to FIGS. 2A and 2B, depicted are perspective views of a non-hermetic and hermetic light source such as a VCSEL and a hermetic VCSEL, respectively, in accordance with one or more embodiments.

Referring specifically to FIG. 2A, depicted are top and bottom perspective views 200A and 200B, respectively, of a non-hermetic VCSEL. The non-hermetic VCSEL can include a lens 205 and a VCSEL wafer 210. The lens 205 can be similar to the lens 125 described herein above in conjunction with FIGS. 1A and 1B.

The lens 205 can be manufactured from one or more substrate materials, such as SiC, GaP, or glass, among others. The substrate can be cut, etched, or diced to suit the size of the application. For example, although only a single VCSEL on wafer 210 is shown in FIG. 2B, it should be understood that many VCSELs can be coupled to the substrate of lens 125.

The VCSEL on wafer 210 pictured in FIG. 2A can be a non-hermetic light source such as VCSEL. A non-hermetic VCSEL can be a VCSEL that the MESA area is not hermetically sealed, or not airtight. The VCSEL on wafer 210 can be a semiconductor laser diode with laser beam emitting perpendicular from the top surface. The VCSEL on wafer 210 can be used in various laser products, including high-speed fiber optic communications. The VCSEL on wafer 210 can have various electrical connections that provide power to the laser diode. When current flows through the VCSEL on wafer 210 via the electrical connections, the VCSEL can emit light of a predetermined wavelength through the lens 205. The lens 205 can collimate the light emitted by the VCSEL on wafer 210 for use in high-speed fiber optic communications.

Referring specifically to FIG. 2B, depicted are top and bottom perspective views 200C and 200C, respectively, of a hermetic VCSEL. The hermetic VCSEL can include a lens 205 and a VCSEL wafer 210, which the MESA area can be hermetically sealed, or airtight. The lens 205 can be similar to the lens 125 described herein above in conjunction with FIGS. 1A, 1B, and 2A.

The laser diode (e.g. the VCSEL) in the VCSEL wafer 210 indicated in view 200D can be sealed within a substrate material used to manufacture the VCSEL on the VECSEL wafer 210. Instead of etching away the majority of the substrate used to create the VCSEL device on the VECSEL wafer 210, a via (e.g., through-hole, etc.) is created to form the electrical connections required to provide the VCSEL with electric current. The VCSEL devices on VCSEL wafer 210 depicted in FIGS. 2A and 2B can be manufactured using a photolithographic process, and can include one or more layers of semiconductor material that form the VCSEL device. VSCEL wafer 210 includes an epitaxial layer above a bulk substrate or an epitaxial layer above an etch stop layer above a bulk substrate (e.g., semiconductor, semiconductor on glass, etc.) in some embodiments. Wafer 210 is shown after cutting into a chip for the VCSEL device including lens 205.

Figure 3A:
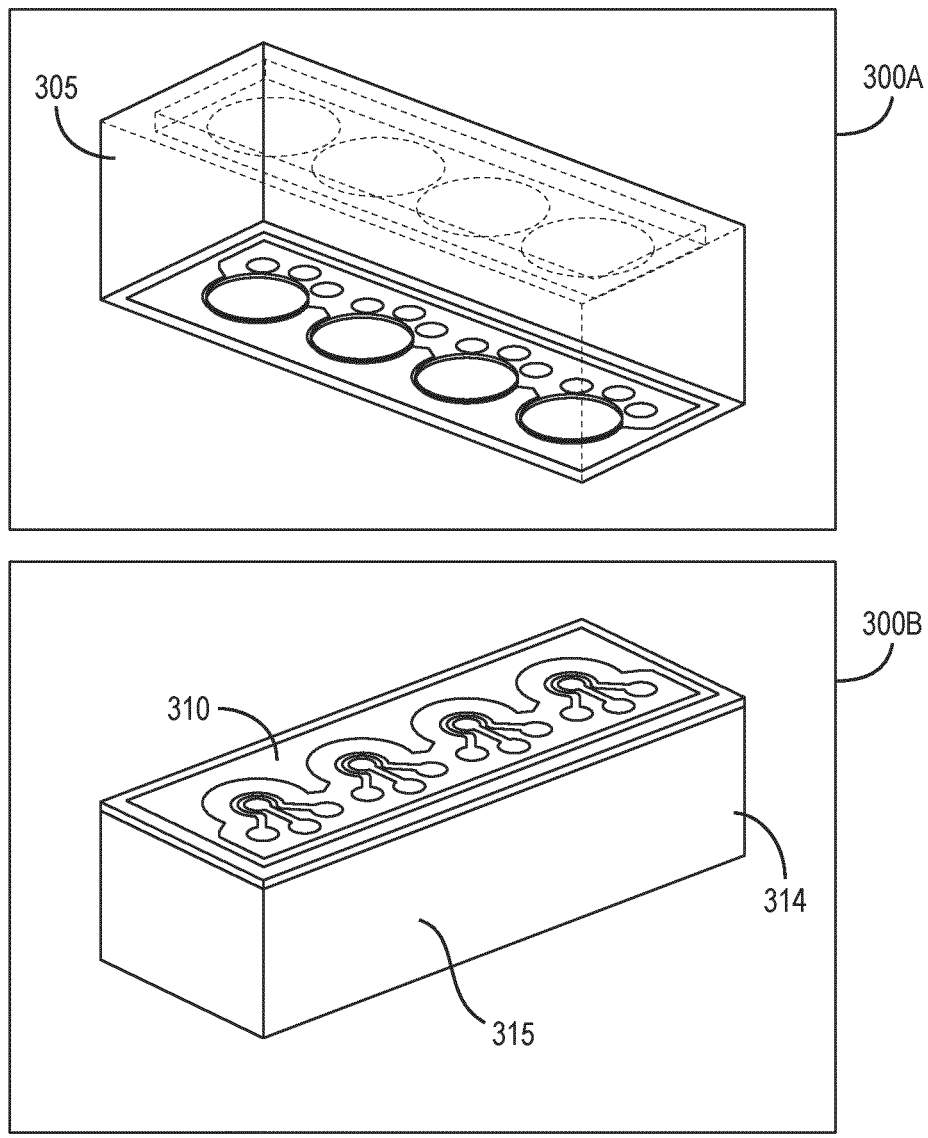
FIGS. 3A, 3B, 3C, and 3D are schematic perspective view drawings showing an example process flow for coupling a photodetector to a microlens, in accordance with one or more embodiments.

Referring now to FIGS. 3A, 3B, 3C, and 3D, depicted are perspective views of an example process flow for coupling a photodetector to a microlens, in accordance with one or more embodiments. Referring specifically to FIG. 3A, depicted is a perspective view 300A of an example lens 305, and a perspective view 300B of an example photodetector 315 on a substrate 314. The example lens 305 can be similar to the lenses 125 and 205 described herein in conjunction with FIGS. 1A, 1B, 2A, and 2B. In some embodiments, the lens 305 can include one or more metal traces or pads, which can be configured to couple with pads 310 of the photodetector 315. In some embodiments, the lens 305 can include metal patterns or other electrically conductive patterns that match metal or conductive pads present on the photodetector 315.

The photodetector 315 can be similar to the photodetector 115 described herein above in conjunction with FIGS. 1A and 1B. The photo detector 315 can be positioned (e.g., coupled to, formed on, etc.) on a substrate 314, such as a silicon compound or a gallium compound. In some embodiments, the photodetector 315 can be formed on the substrate 314 using one or more photolithographic techniques. The photodetector 315 can have an aperture that can be used to detect light. The aperture can have a dimension that is about 30 microns. In some embodiments, the aperture can be less than 30 microns, for example when the lens 305 is configured to focus incoming light onto a smaller spot size on the photodetector 315. Each of the photodetector 315 and the lens 305 can be formed as part of a wafer of photodetectors 315 and lens 305, respectively. Thus, although FIG. 3A depicts only four lenses and four photodetectors 315, it should be understood that more of fewer lens 305 and photodetectors 315 are possible. In some embodiments, each of the lenses 305 can correspond to a respective photodetector 315.

Figure 3B:
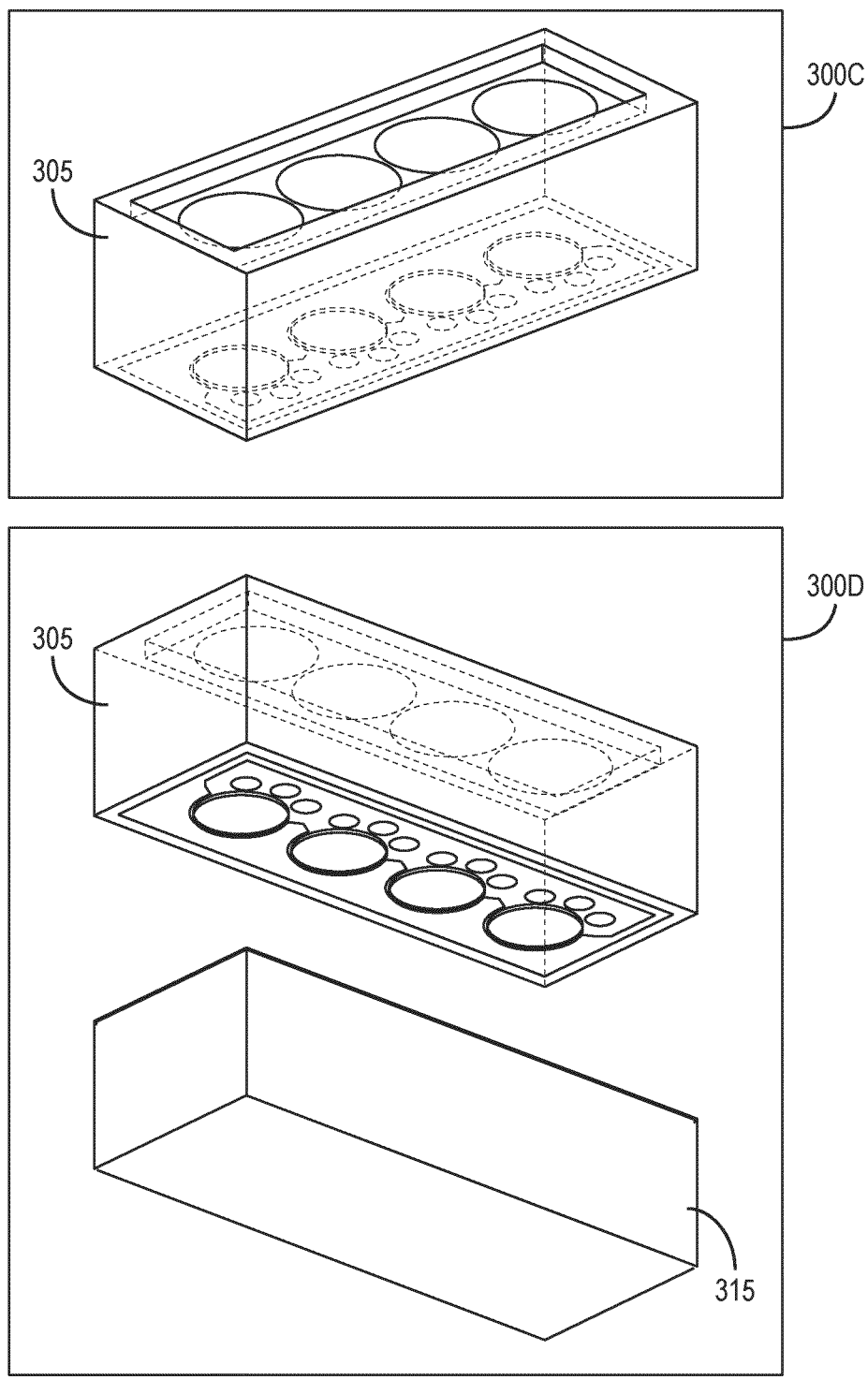

Referring now to FIG. 3B, depicted is a top perspective view 300C of the lens 305 shown in FIG. 3A, and a bottom perspective view 300D of the lens 305 wafer being positioned over the photodetector 315 wafer shown in FIG. 3A. At this stage in the process flow, to couple each lens 305 to each respective photodetector 315 (e.g., such that the lens 305 can focus the light onto the aperture of the photodetector 315, etc.), the lens 305 can be positioned over the photodetector 315 such that the metal pads of the lens 305 align with corresponding metal pads 310 or contact points on the detector 315. Alignment based on the pads allows precise bonding of the lens 305 wafer to the photodetector 315 wafer. In some embodiments, a conductive epoxy can be used as an intermediate to bond between the metal pads.

Figure 3C:
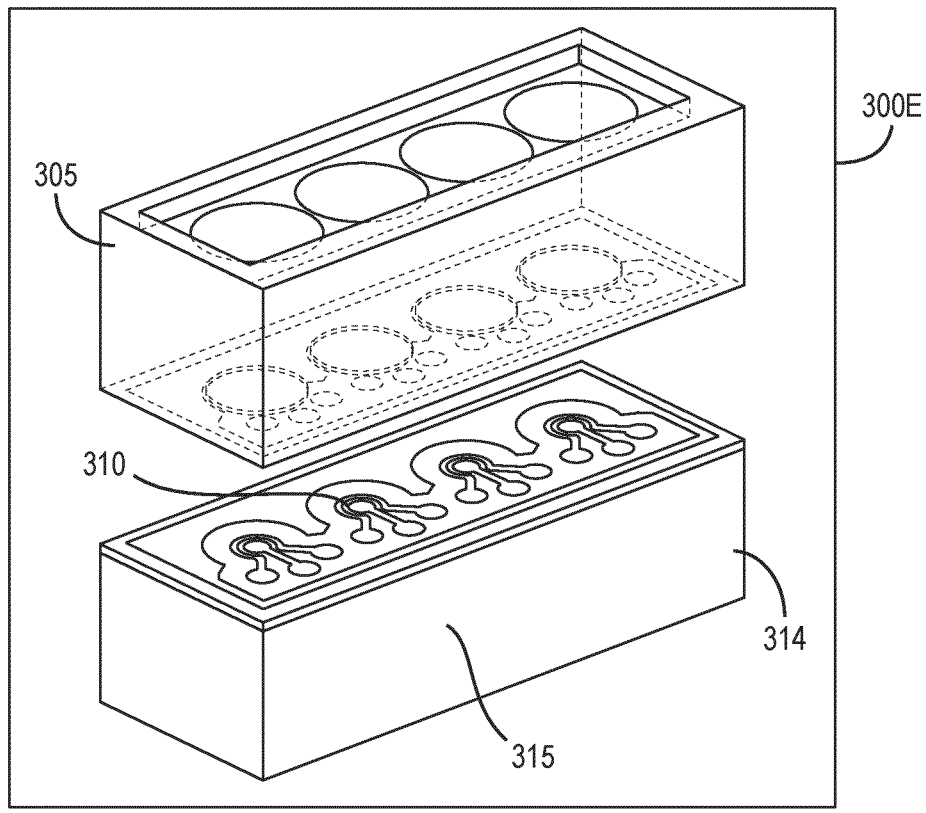
Figure 3C:
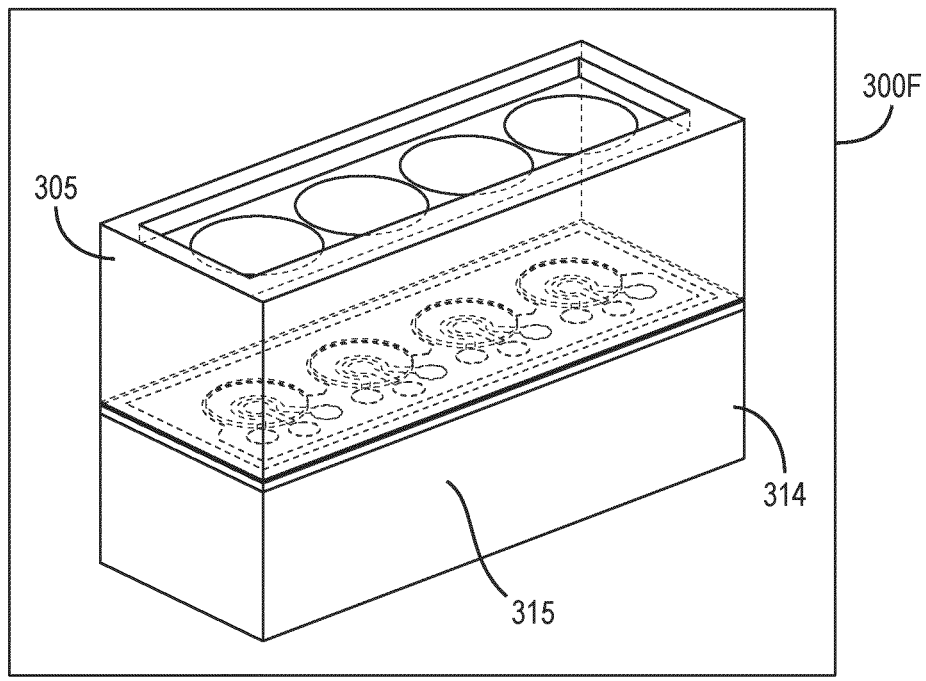

Referring now to FIG. 3C, depicted is a top perspective view 300E of the alignment process shown in FIG. 3B, and a top perspective view 300F of a bonding process used to bond the wafer of lens 305 to the wafer of photodetector 315. At this stage in the process flow, after aligning the wafer of lens 305 and the wafer of photodetector 315, the wafers can be bonded to one another using a bonding technique. The bonding techniques can include, for example, thermal compression bonding, epoxy bonding, mechanical bonding, or another type of bonding technique. Bonding the substrate of the lens to the substrate 314 of the photodetector 315 can seal the perimeter of the device.

Figure 3D:
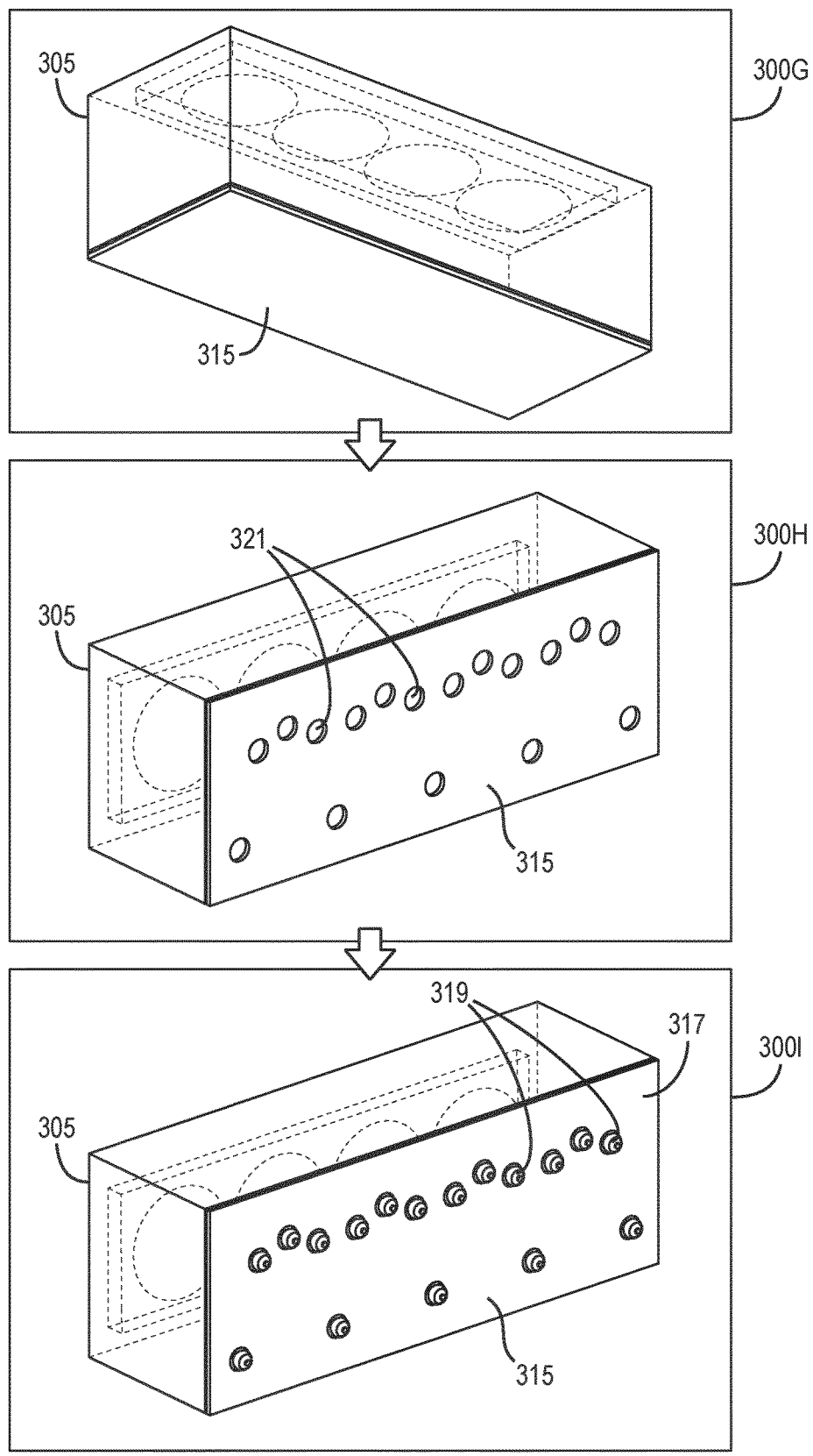

Referring now to FIG. 3D, depicted is a bottom perspective view 300G of a processed substrate 317 following the bonding of the lens 305 to the substrate 314 of photodetector 315, a bottom perspective view 300H following an etching process on the epitaxial layer 317 of photodetector 315, and a bottom perspective view 300I of the device after adding gold stud bumps or gold studs 319 to the conductive pads 321 shown in view 300H.

View 300G depicts the substrate 314 (FIG. 3C) following the bonding process described above in conjunction with FIG. 3C, and following additional processing steps. After the photodetectors 315 have been bonded to the lens, the substrate 314 supporting the epi-structure of the photodetectors 315 is no longer needed. The epi-structure of the photo detectors 315 can instead be supported by the wafer of the lens 305, which is now coupled directly to the photodetectors 315 via one or more metal pads or other bonds. The processing steps can include grinding away most of the substrate 314 under the detectors 315 using one or more substrate grinding techniques. The processing steps can include chemically etching the layer on which the photodetectors 315 were formed, following the grinding process, up until an etch stop layer. Etch stop layers are selected depending on the substrate material that is being etched. Thus, for a photodetector with an Indium Phosphide substrate, the etch stop layer can be an InGaAs layer. The etching solution is a mixture of hydrochloric acid and phosphoric acid. The etch stop layer does not react with the etchant used to remove most of the substrate on which the photodetectors 315 were formed, thereby halting the etching process.

View 300H depicts a result of a subsequent etching process that follows the substrate removal process depicted in view 300G. The substrate etching process can include etching contact vias to a gold bonding layer. The gold bonding layer can include one or more conductive pads 321 that are electrically coupled to the photodetectors 315, and can be used to form electrical connections between the photodetectors 315 and other components (e.g., the TIA 110 depicted in FIGS. 1A and 1B, etc.).

View 300I depicts a bottom perspective view of the pads depicted in view 300H, now bonded with gold studs 319. The gold studs 319 can be used to electrically couple the pads to one or more electrical components. The gold studs 319 can be formed on the contact pads, for example, using a wire bonder which place a gold ball on the pads. After the gold ball is placed, the wire is cut off. Thus, the process flow depicted in FIGS. 3A-3D can be used to produce a photodetector 315 device with an integrated lens that can focus light onto a small aperture of the photodetector 315. Doing so can improve the overall throughput of high-speed data communications systems that rely on the photodetector 315 device, such as fiber-optic communications systems. Further, the device can be designed in a way that reduces the overall capacitance of the system, thereby reducing noise experienced by a TIA (e.g., the TIA 110, etc.) and therefore improving signal to noise.

Figure 4A:
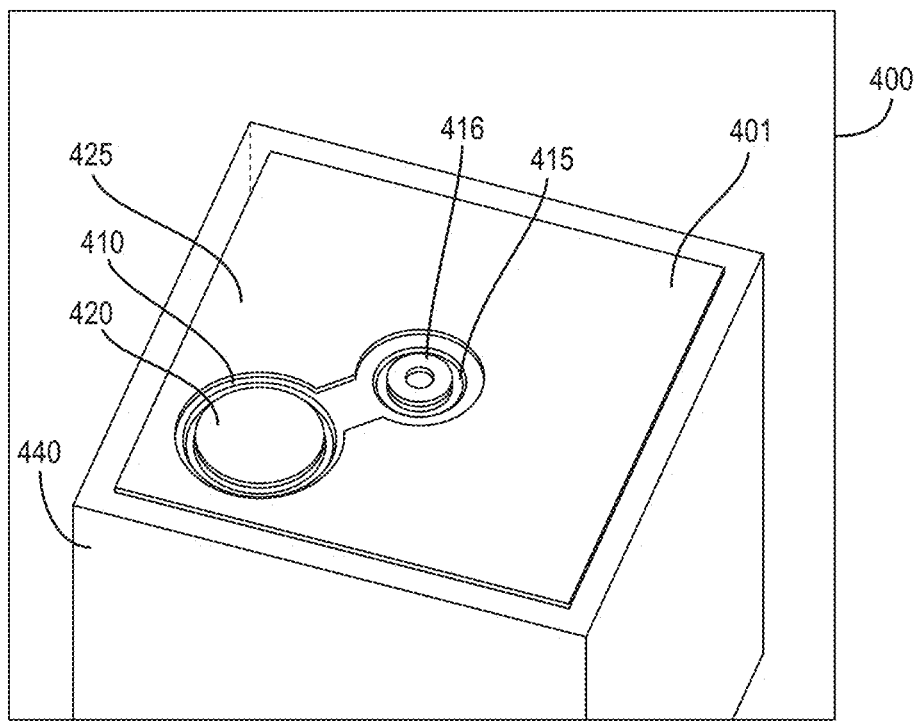
FIGS. 4A and 4B are schematic perspective view drawings of a VCSEL substrate and a microlens substrate, respectively, in accordance with one or more embodiments.
Figure 4B:
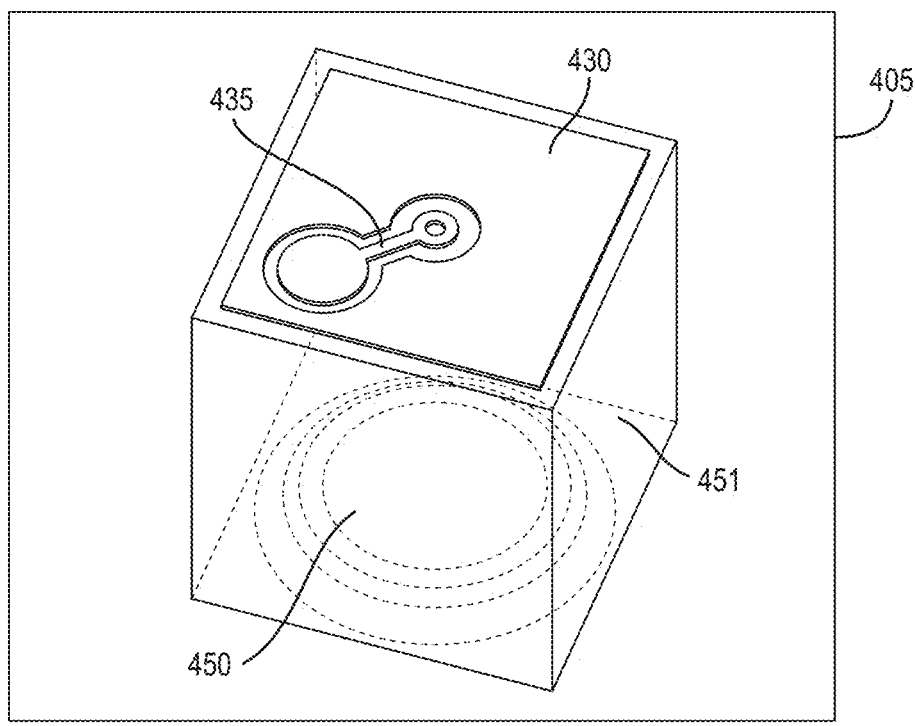

Referring now to FIGS. 4A and 4B, depicted are perspective views of a VCSEL substrate and a microlens substrate, respectively, in accordance with one or more embodiments. Referring specifically now to FIG. 4A, depicted is a view 400 of a VCSEL device (e.g., a VCSEL diode) formed on a VCSEL substrate 440. The VCSEL diode is positioned in the center of the surface 401 of the VCSEL substrate 440, and includes a metal ring 416 about its circumference, which is separated from a floating metal pad 425 (which minimizes capacitance of the system) by an oxide trench etch 415. The substrate 440 can also include a bonding pad 420 for a P-contact of the VCSEL device, which can be separated from the floating metal pad 425 by the trench etch to the past active layer 410. The metal pads, such as the bonding pad 420, the floating metal pad 425, and the metal electrode or ring 416 positioned at the circumference of the VCSEL diode, can have corresponding metal bonding pads positioned on a lens substrate 451, as depicted in FIG. 4B.

Referring now to FIG. 4B, depicted is a view 405 of a lens 450 having embedded metal pads 430 and 435. The metal pad 430 is a floating metal pad in some embodiments. The pad 435 is an electrical connection pad and can connect the P-contact to the ring 416 surrounding the VCSEL diode once a substrate 451 of the lens 450 is coupled to the VCSEL substrate 440 depicted in FIG. 4A. The VCSEL substrate 440 can be coupled to the lens substrate 451 using a bonding process similar to that of the process described herein above in conjunction with FIGS. 3A-3D. The pad 425 depicted in FIGS. 4A and 4B can be used to manufacture a hermetic VCSEL device in some embodiments. Non-hermetic VCSEL devices can be manufactured using different configurations of metal pads, as described herein.

Referring now to FIGS. 5A, 5B, 5C, 5D, and 5E, depicted are perspective views of example process flow for coupling a hermetic VCSEL to a microlens, in accordance with one or more embodiments. The process flow depicted show the steps of affixing the lens substrate 451 to the VSCEL substrate 440, such that the lens substrate 451 can collimate light emitted by the VSCEL diode, and the VCSEL diode can receive electric power via the metal pads exposed on the VCSEL substrate. The lens substrate 650 can be similar to the lens substrates described herein (e.g., the lens 125, the lens 305, the lens 450, etc.). The VCSEL substrate 440 can include a VCSEL diode at its center, or at any other desired location in the VCSEL substrate 440. The device manufactured in the process flow depicted in FIGS. 5A, 5B, 5C, 5D, and 5E can be a hermetic, or airtight, VCSEL device.

Figure 5B:
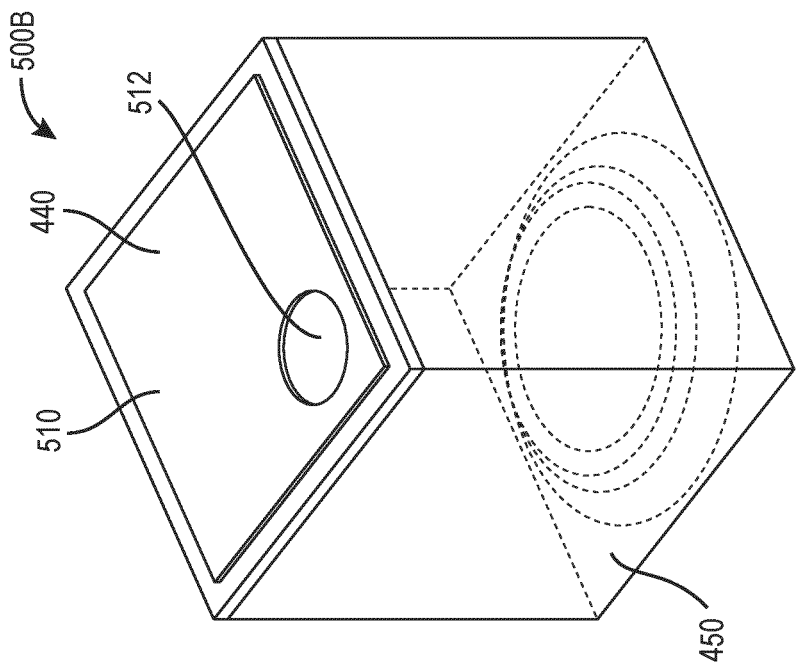
FIGS. 5A, 5B, 5C, 5D, and 5E are schematic perspective view drawings showing an example process flow for coupling a hermetic VCSEL to a microlens, in accordance with one or more embodiments.
Figure 5A:
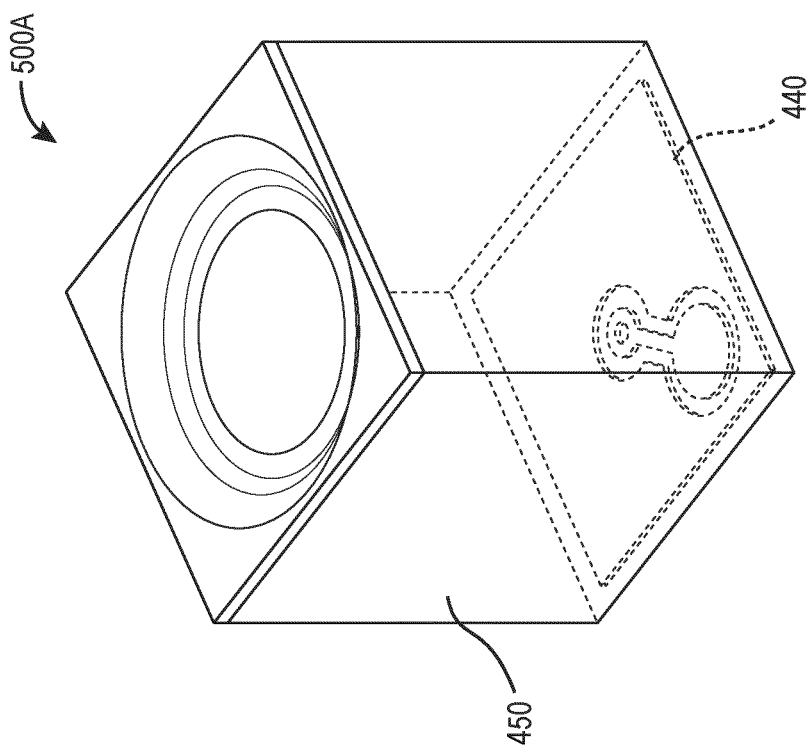

Referring specifically now to FIG. 5A, depicted is a perspective view 500A of a step in the process flow similar to that depicted in view 300G of FIG. 3D. At this stage in the process, the VCSEL substrate 440 has been aligned with and bonded with the lens substrate 451. Aligning the VCSEL substrate 440 to the lens substrate 451 can include aligning the corresponding metal pads on the VCSEL substrate 440 to those on the lens substrate 451, as depicted in FIGS. 4A and 4B. After alignment, the VCSEL substrate 440 can be bonded to the lens substrate 451 using a bonding technique. The bonding techniques can include, for example, thermal compression bonding, epoxy bonding, mechanical bonding, or another type of bonding technique.

After bonding the VCSEL substrate 440 to the lens substrate 451, the majority of the VCSEL substrate (e.g., portions not including layers designated for the diode, and some buffer layers, etc.) can be ground away using a grinding process. The grinding process can be performed using an abrasive surface, or another type of grinding technique. Next, remaining portions of the underside can be etched to an etch-stop layer, and the etch-stop layer can itself be removed using another etching process.

Referring specifically now to FIG. 5B, depicted is a perspective view 500B of the next stage in the process flow, where a metal layer can be deposited on the underside of the VCSEL substrate 440, using a metal deposition technique. Metal deposition techniques can apply a metal layer 510, which can include a material with a high conductivity, such as gold, platinum, or silver. In some embodiments, metal can be deposited using a metal evaporation (e.g., electron beam evaporation, etc.) and lift-off process. Such a process can be used to deposit controlled layers of precious, or conductive, metals onto the surface of a substrate in precise patters. The pattern of the metal of metal layer 510 can include a hole portion 512, which can be etched away to form a via to the metal layer 430 depicted in FIG. 4B, which is electrically coupled to the metal portion surrounding the VCSEL diode.

Figure 5D:
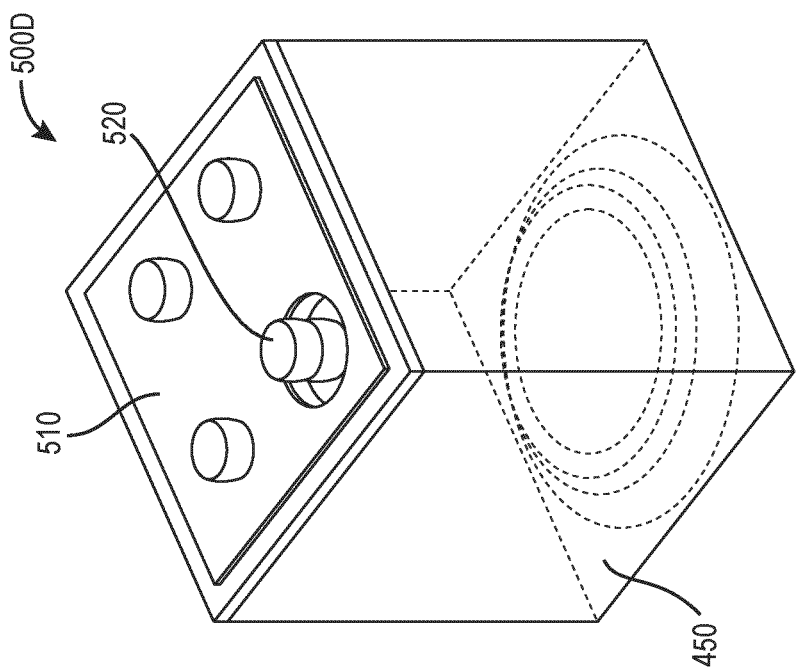
Figure 5C:
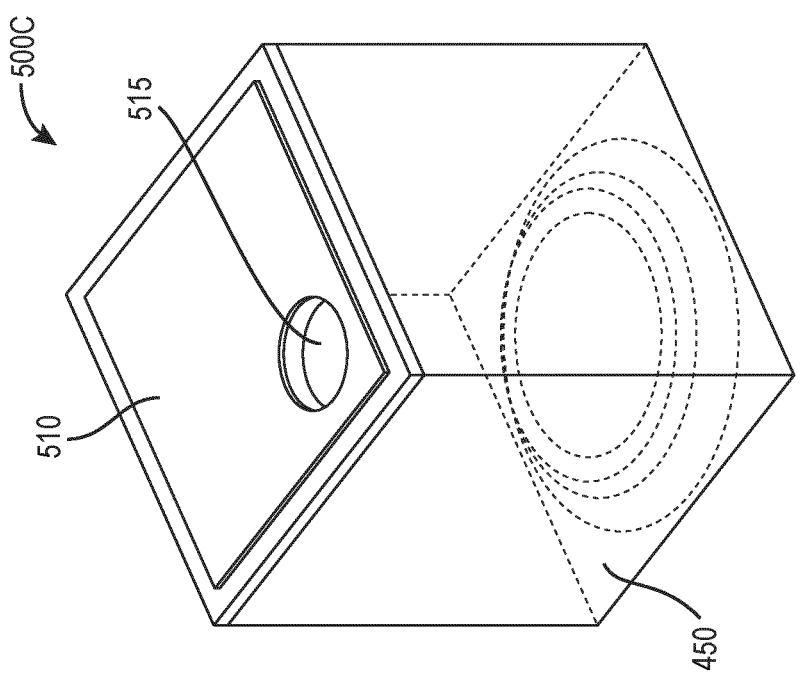

Referring specifically now to FIG. 5C, depicted is a perspective view 500C of the results of a further etching process to the metal layer 430 shown in FIG. 4B, which is electrically coupled to the metal layer surrounding the circumference of the VCSEL diode. The etching process can etch through the epi-structure of the VCSEL substrate 440, and can expose a surface 515 of the metal layer 430 depicted in FIG. 4B. In some embodiments, an additional plating step can be performed to increase the thickness of the surface 515 of the metal layer 430 when it is exposed through the epi-structure of the VCSEL substrate 440.

Referring specifically now to FIG. 5D, depicted is a perspective view 500D of the final stage in the process flow, where gold contact bumps 520 are fused to the metal layer 510 and to the surface 515 of the metal layer 430, which can be electrically coupled (or bonded) to other electronic components, such that the other electronic components can provide electric power to the VCSEL diode formed in the VCSEL substrate. Because most of the second metal layer associated with pad 425 is floating, and not connected to a voltage or current source, the overall capacitance of the VCSEL device is reduced, which is an improvement over some other embodiments. The metal layer 510 and the metal layer 430 can form the electrodes that, when supplied with appropriate electric current, cause the VCSEL diode to emit a predetermined wavelength of light. The light emitted by the VCSEL is then collimated by the lens 450 now integrated with the VCSEL device via the lens substrate 450.

Figure 5E:
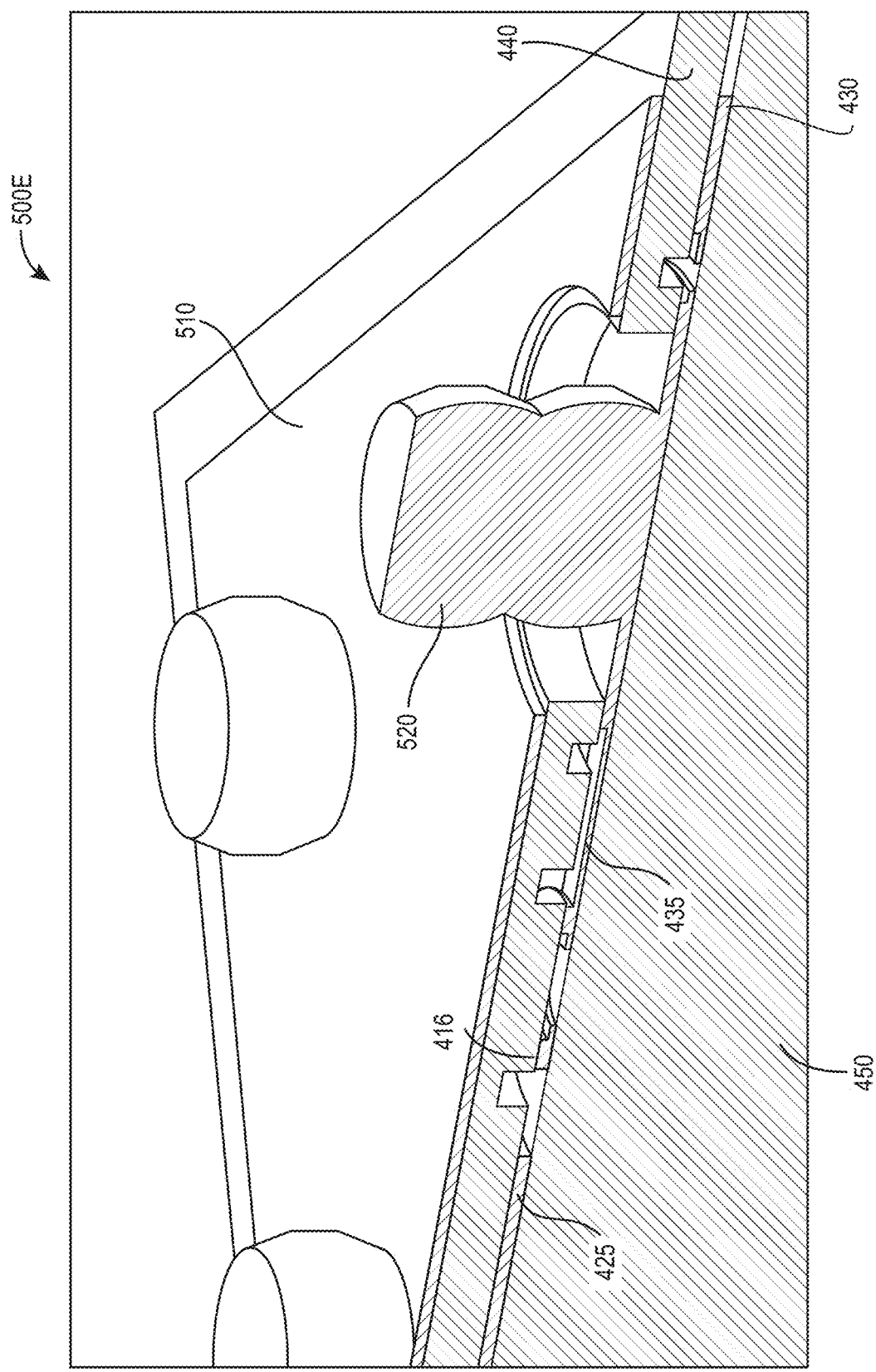

Referring specifically now to FIG. 5E, depicted is a cross-sectional view 500E of the completed hermetic VCSEL device formed in the process flow described herein above. As shown in the cross-sectional view, the metal layer 430 and the metal layer 510 form the anode and the cathode electrodes of the VCSEL diode centered in a surface of the epitaxial layer of the VCSEL substrate 440. Each of these electrodes are coupled to gold contact bumps 520, which can be electrically coupled to other components in a system (e.g., an amplifier, a voltage source, a current source, etc.) via one or more bonding techniques (e.g., solder bonding, thermal compression bonding, epoxy bonding, thermosonic bonding, etc.).

The second metal layer associated with pad 425 binds the lens substrate 450 to VCSEL substrate 440 (e.g., including an epitaxial layer) can be disconnected from any charge carrying circuit (e.g., floating). As described herein above, light emitted by the VCSEL diode can be received and collimated by the lens 450 such that the light is suitable for high data-rate applications.

Referring now to FIGS. 6A, 6B, 6C, 6D, 6E, 6F, and 6G, depicted are perspective views of example process flow for coupling a non-hermetic VCSEL to a microlens, in accordance with one or more embodiments. The process flow shown in FIGS. 6A, 6B, 6C, 6D, 6E, 6F, and 6G can be similar to the process flow described herein above in conjunction with FIGS. 5A, 5B, 5C, 5D, and 5E, but instead used to manufacture non-hermetic VCSEL devices instead of hermetic VCSEL devices. The process flow depicted show the steps of affixing the lens of the lens substrate 650 to the VSCEL substrate 640, such that the lens 450 can collimate light emitted by the VSCEL diode, and the VCSEL diode can receive electric power via the metal pads exposed on the VCSEL substrate. The lens substrate 650 can be similar to the lens substrates described herein (e.g., the lens 125, the lens 305, the lens 450, etc.), and the VCSEL substrate can be similar to the VCSEL substrates described herein. The device manufactured in the process flow depicted in FIGS. 5A, 5B, 5C, 5D, and 5E can be a hermetic, or airtight, VCSEL device.

Referring specifically now to FIG. 6A, depicted is a view 600A of a lens substrate 650 having patterned metal pads 605 and 610. The metal pads can include floating metal pads 610, similar to the floating metal pad 425 depicted in FIG. 4B. The electrical connection pad 605 can connect the P-contact to the pad surrounding the VCSEL diode once the lens of lens substrate 650 is coupled to the VCSEL substrate 640 depicted in FIG. 6B. The VCSEL substrate 640 can be coupled to the lens substrate 650 using a bonding process similar to that of the process described herein above in conjunction with FIGS. 3A-3D, and the bonding process described herein above in conjunction with FIGS. 4A-4B and 5A-5E. The floating metal pad 610 depicted in FIG. 6A and can be used to manufacture a non-hermetic VCSEL device.

Referring specifically now to FIG. 6B, depicted is a view 600B of a VCSEL diode device formed on a VCSEL substrate 640. VCSEL diode can be positioned in the center of the surface of the VCSEL substrate, and can include a metal ring about its circumference, which is separated from the floating metal pads 615 by space created using a patterned etching process. The substrate 640 can also include a bonding pad 620 for a P-contact of the VCSEL device, which is also separated from the floating metal pad 615 by space created using an etching process. The metal pads, such as the bonding pad 620 (e.g., which doubles as an electrode for the VCSEL diode, etc.) and the floating metal pads 615 can have corresponding metal bonding pads positioned on a lens substrate, as depicted in FIG. 6A.

Figure 6D:
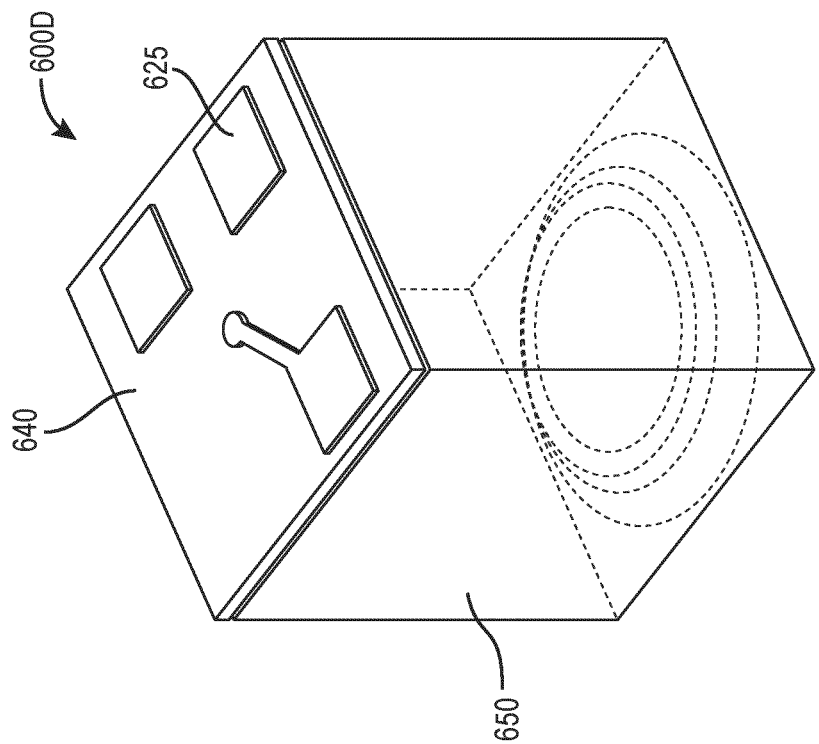
Figure 6C:
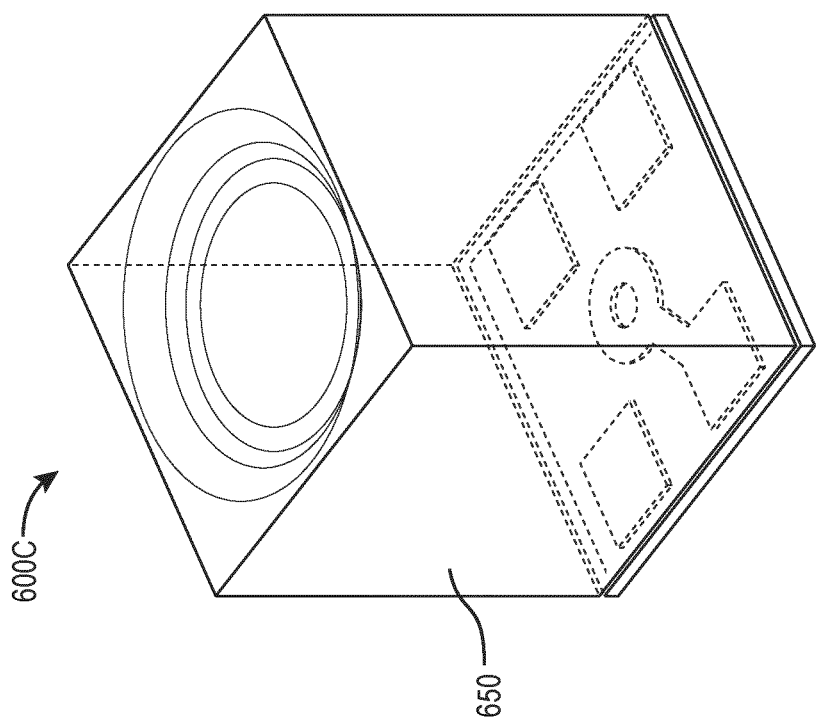

Referring specifically now to FIG. 6C, depicted is a perspective view 600C of a step in the process flow similar to that depicted in view 300G of FIG. 3D and that depicted in view 500A of FIG. 5A. At this stage in the process, the VCSEL substrate 640 has been aligned with and bonded with the lens substrate 650. Aligning the VCSEL substrate 640 to the lens substrate 650 can include aligning the corresponding metal pads on the VCSEL substrate 640 to those on the lens substrate 650, as depicted in FIGS. 6A and 6B. After alignment, the VCSEL substrate 640 can be bonded to the lens substrate 650 using a bonding technique. The bonding techniques can include, for example, thermal compression bonding, epoxy bonding, mechanical bonding, or another type of bonding technique.

After bonding the VCSEL substrate 640 to the lens substrate 650, the majority of the VCSEL substrate (e.g., portions not including layers designated for the diode, and some buffer layers, etc.) can be ground away using a grinding process. The grinding process can be performed using an abrasive surface, or another type of grinding technique. Next, remaining portions of the underside can be etched to an etch-stop layer, and the etch-stop layer can itself removed using another etching process Referring specifically now to FIG. 6D, depicted is a perspective view 600D of the next stage in the process flow, where a metal layer 625 can be pattern-deposited on the underside of the VCSEL substrate 640, using a metal deposition technique. Metal deposition techniques can apply a metal layer 625, which can include a material with a high conductivity, such as gold, platinum, or silver. In some embodiments, metal can be deposited using a metal evaporation (e.g., electron beam evaporation, etc.) and lift-off process. Such a process can be used to deposit controlled layers of precious, or conductive, metals onto the surface of a substrate in precise patters. The pattern of the metal layer 625 can include portions that correspond to the pads 605, 615, and 620 describe herein, and can be positioned to create corresponding anode and cathode electrodes for the VCSEL diode.

Figure 6F:
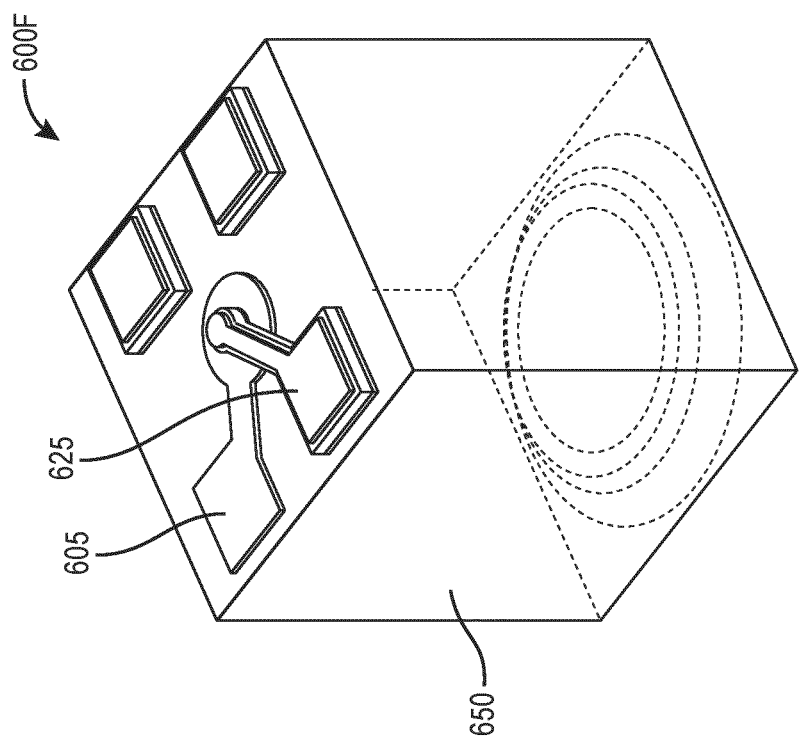
Figure 6E:
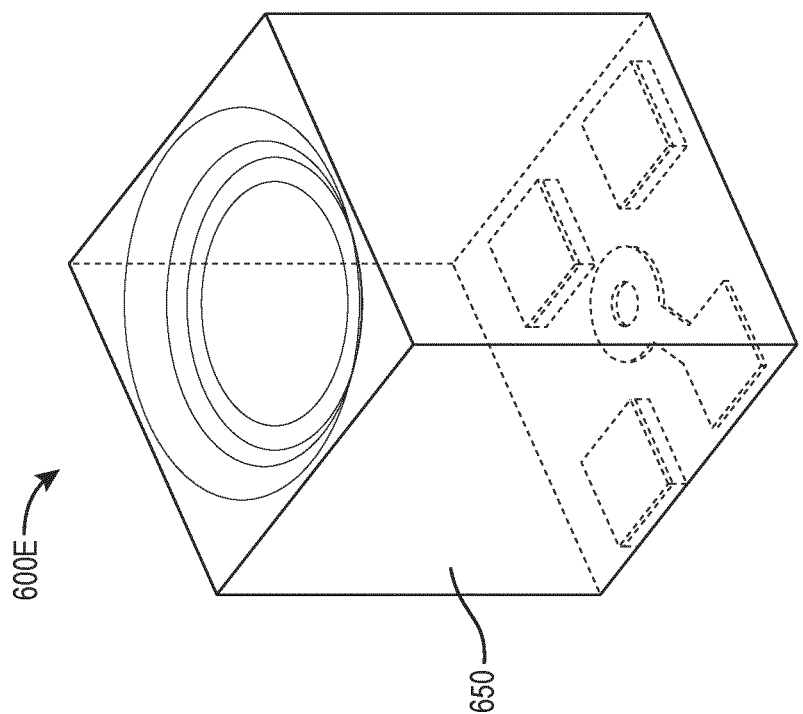

Referring now to FIGS. 6E and 6F, depicted is a perspective view 600E of a top portion of the VCSEL device following an etching process, and a perspective view 600F of a bottom portion of the VCSEL device following the etching process, respectively. The etching process can etch through the epi-structure of the VCSEL substrate 640, and can expose a surface the metal layer of pad 605 depicted in FIG. 6A. The metal layer of pad 605 and the metal layer 625 can form the electrodes of the VCSEL diode formed in the remaining VCSEL substrate. The metal layer of pad 605 and metal layer 625 can be positioned to minimize overlap of both electrodes, thereby reducing the overall capacitance of the device.

Figure 6G:
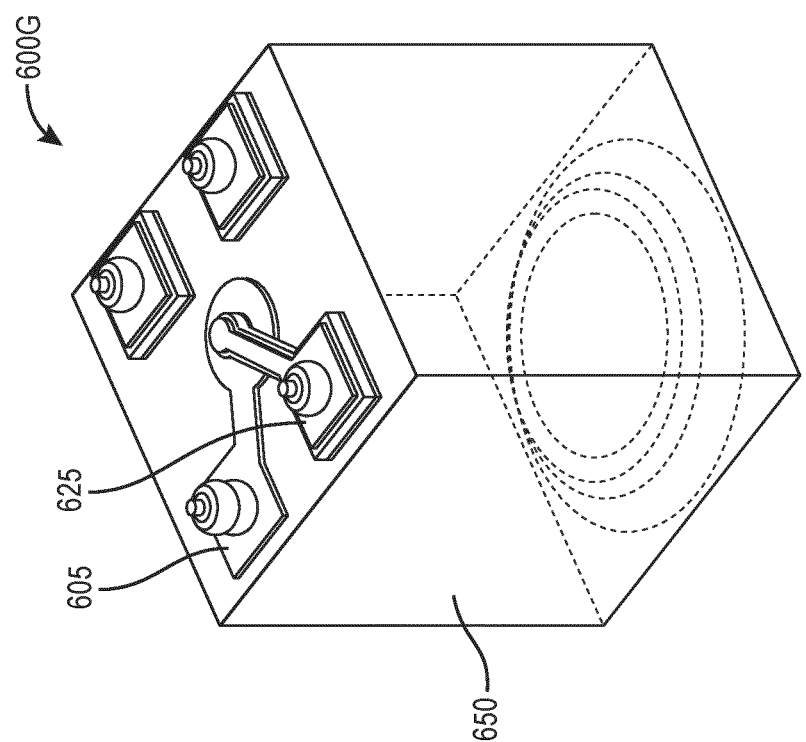

Referring now to FIG. 6G, depicted is a perspective view 600G of the final portion of the process flow for manufacturing the non-hermetic VCSEL device, in which gold contact bumps are secured to the pads or electrodes associated with metal layer 625 and pad 605, similar to the process described herein in conjunction with FIG. 5D. The gold contact bumps can be fused or bonded to the metal layer associated with pad 605 and metal layer 625, which can be electrically coupled to the VCSEL diode. Following the bonding process, the gold contact bumps can then be can be electrically coupled (or bonded) to other electronic components, such that the other electronic components can provide electric power to the VCSEL diode formed in the VCSEL substrate. The metal layer associated with pad 605 and metal layer 625 can form electrodes that, when supplied with appropriate electric current, cause the VCSEL diode to emit a predetermined wavelength of light. The light emitted by the VCSEL is then collimated by the lens 450 through the lens substrate 650 now integrated with the VCSEL device.

Figure 7A:
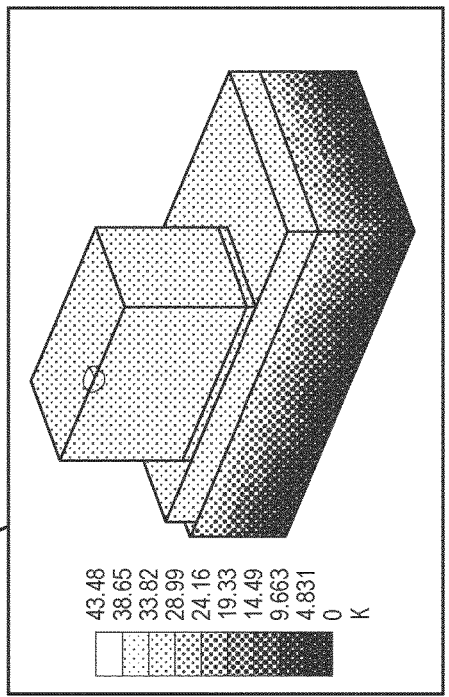
FIGS. 7A, 7B, and 7C are schematic perspective view drawings of VCSEL devices showing comparisons of VCSEL temperature for different microlens materials, in accordance with one or more embodiments.
Figure 7C:
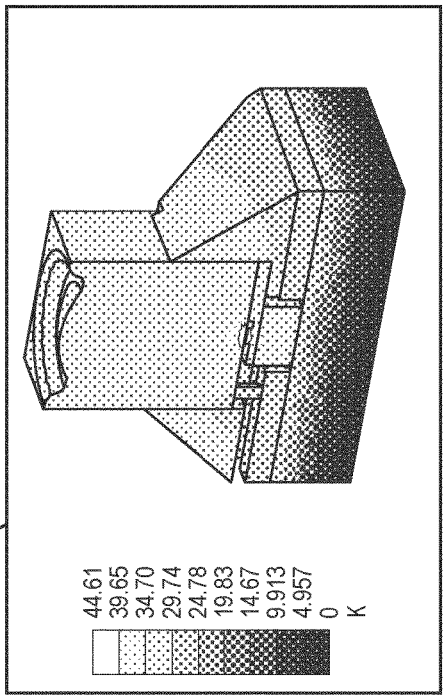
Figure 7B:
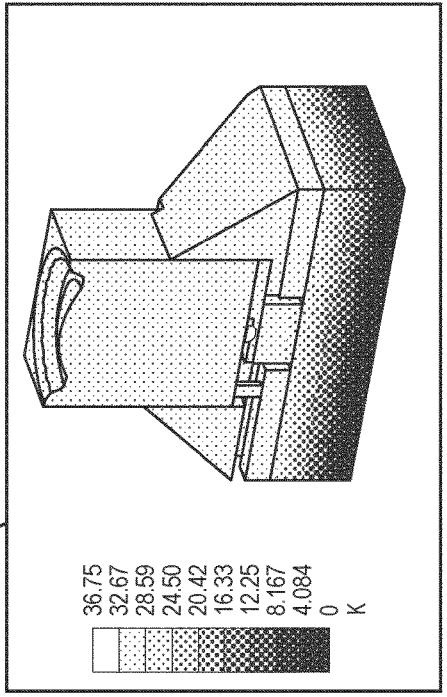

Referring now to FIGS. 7A, 7B, and 7C, depicted are example comparisons of VCSEL temperature for different microlens materials, in accordance with one or more embodiments. Referring specifically to FIG. 7A, depicted is a rendering 700A of the thermal characteristics of a VCSEL device in a P-Up configuration and manufactured in a gallium arsenic (GaAs) process. As indicated, the maximum temperature rise of the VCSEL diode is about 43.5 degrees Celsius. The thermal conductivity of the GaAs can be about 46 watts per meter-Kelvin. Referring specifically to FIG. 7B, depicted is a rendering 700B of the thermal characteristics of a VCSEL device integrated with a GaP lens, using the techniques described herein. The maximum temperature rise of the VCSEL diode in this configuration can be about 36.75 degrees Celsius. The thermal conductivity of the GaP can be about 110 watts per meter-Kelvin. Referring specifically to FIG. 7C, depicted is a rendering 700C of the thermal characteristics of a VCSEL device integrated with a glass lens, using the techniques described herein. The maximum temperature rise of the VCSEL diode in this configuration can be about 44.61 degrees Celsius. The thermal conductivity of the glass can be about 1,114 watts per meter-Kelvin.

Referring now to FIGS. 8A and 8B, depicted are perspective views 800A and 800B, respectively, of an example pick-and-place tool 805 for the devices described herein, in accordance with one or more embodiments. The pick-and-place tool 805 can be configured to couple to one or more of the devices described herein, such as a photodetector or a VCSEL not integrated with a lens. For example, the pick-and-place tool 805 can be temporarily coupled to a photodetector, such as the photodetector 115 (FIGS. 1A-B). The pick-and-place tool 805 can be used to accurately position the photodetector 115 (or a VCSEL device described herein, etc.) to a desired location, such as on a printed circuit board or another type of carrier (e.g., the carrier 105, etc.).

Referring specifically now to FIG. 8A, depicted is the main body of the pick-and-place tool 805. The pick-and-place tool 805 can be coupled to one or more connectors of a pick-and-place robot assembly. A pick-and-place robot can be used to accurately position devices "picked up" by the pick-and-place tool 805 to a desired destination, which can be programmed or specified using computer-readable instructions. The pick-and-place tool 805 can be formed from a material that will not react or alter the materials of the devices it is used to position (e.g., the photodetectors described herein, the VCSEL devices described herein, etc.).

Referring specifically to FIG. 8B, depicted is a zoomed in perspective view 800B of the end 810 of the pick-and-place tool 805 that is responsible for transporting one or more optical devices (e.g., the photodetectors, the VCSEL devices, etc.) described herein. The face 811 and face 812 of the pick-and-place tool 805 can include a precision step at end 810 that can be polished such that it is offset from the base of the pick-and-place tool 805 by a predetermined step height, with a tolerance of less than about 1 micron. When the pick-and-place tool 805 is used to place photodetectors or VCSEL devices on a carrier (e.g., such as the carrier 105, etc.), the step height can define the distance between the aperture of the optical device and the bottom of the lens. This height can be selected to optimize the spot size, for example, when creating detector devices. In some embodiments, the face 812 of the pick-and-place tool 805 can coupled with the top portion (e.g., the surface having the aperture, etc.) of the optical devices described herein when performing pick-and-place operations.

Referring now to FIGS. 9A, 9B, 9C, 9D, 9E, and 9F, depicted are perspective views of an example die attachment sequence to manufacture the device depicted in FIGS. 1A and 1B, in accordance with one or more embodiments. While the process flow here is depicted for a device having a photodetector, it should be understood that similar techniques can be used to manufacture devices having one or more VCSEL emitter devices, or other types of optical devices.

Figure 9A:
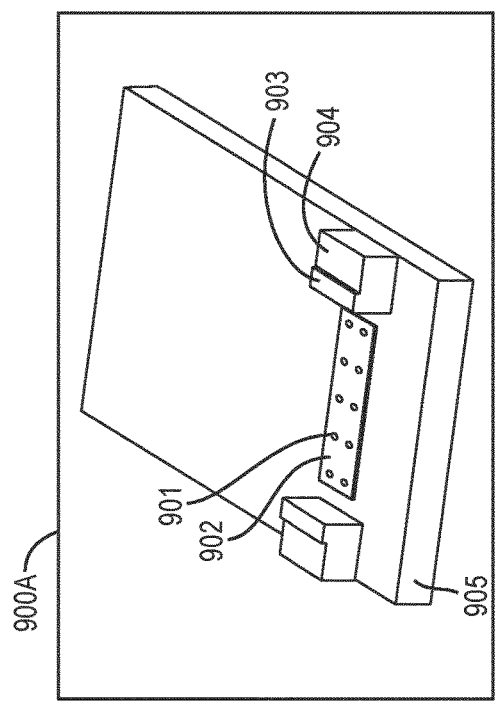
FIGS. 9A, 9B, 9C, 9D, 9E, and 9F are schematic perspective view drawings of an example die attachment sequence, in accordance with one or more embodiments.

Referring specifically now to FIG. 9A, depicted is a perspective view 900A of a carrier 905, which can be similar to the carrier 105 described herein in conjunction with FIGS. 1A and 1B. The carrier 905 can be any type of carrier that is capable of coupling to an optical device, such as a photodetector or a VCSEL emitter. As depicted, the carrier 905 includes guide posts that can be used to mount a lens in further processing steps, and can include a gold conductive surface (e.g., to act as a ground plane for an amplifier and other components mounted to the carrier 905, etc.). Gold stud bumps 901 can be disposed on the surface of the carrier by the method described earlier. A layer of epoxy 902 or other types of adhesives or glues, which can be used to secure an optical device to the body of the carrier 905. The carrier 905 can be formed from a metal, an epoxy substrate, a silicon substrate, a plastic substrate, or any other type of substrate that can be coupled to electronic components. In some embodiments, the carrier 905 can be formed form by machining, an injection molding process, a photolithographic manufacturing process, an additive manufacturing process (e.g., 3D printing, etc.), among others.

Figure 9C:
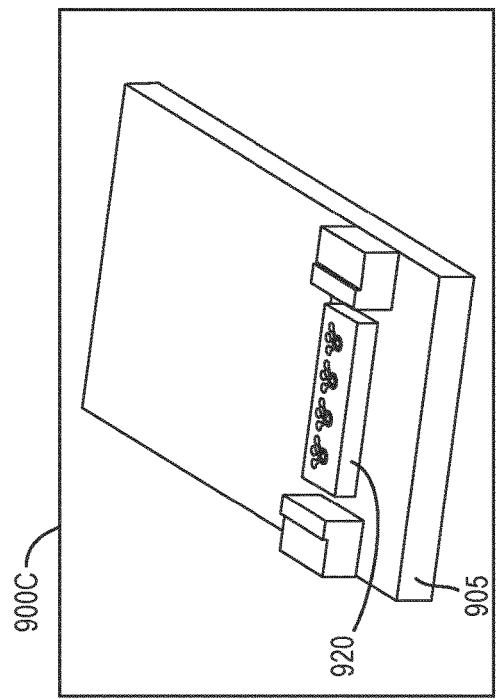
Figure 9B:
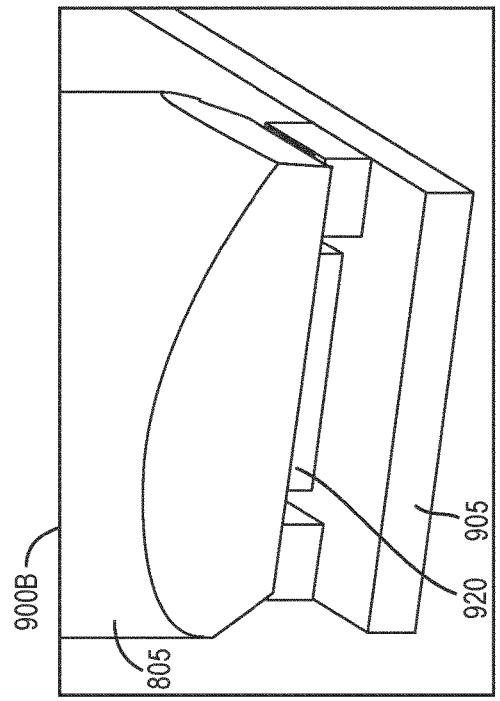

Referring specifically now to FIG. 9B, depicted is a perspective view 900B of the next stage of the manufacturing process, where the pick-and-place tool 805 can be used to position a photodetector 920 onto the epoxy or adhesive region defined on the carrier 905. The photodetector 920 can be similar to the photodetectors described herein. When placing the photodetector 920, the face 811 of the pick-and-place tool 805 can sit flush with the surface 903 of guide posts for the lens that are defined on the carrier 905. The step height of the end 810 of the pick-and-place tool 805 can therefore define the distance between the surface (e.g., the aperture, etc.) of the photodetector 920 and the bottom of the lens that will be mounted to the guide posts of the carrier 905 in later processing steps. The surface of the photodetector can be referenced from the surface of the spacer end 810 of the pick-and-place tool 805. The gold stud bumps 901 will be compressed. The gold stud bumps 901 support the photodetector while the epoxy 902 is curing.

Referring specifically now to FIG. 9C, depicted is a perspective view 900C of the next stage of the manufacturing process, where the photodetector 920 has been secured to the epoxy layer disposed on the surface of the carrier 905, and the pick-and-place tool 805 has been removed. In some embodiments, the pick-and-place tool 805 can hold the photodetector 920 in place for a predetermined curing time to secure the detector 920 to the carrier 905. In some embodiments, the pick-and-place tool 805 can hold the detector 920 until a light-based curing process causes the epoxy layer to harden, thereby securing the detector 920 to the surface of the carrier 905.

Figure 9D:
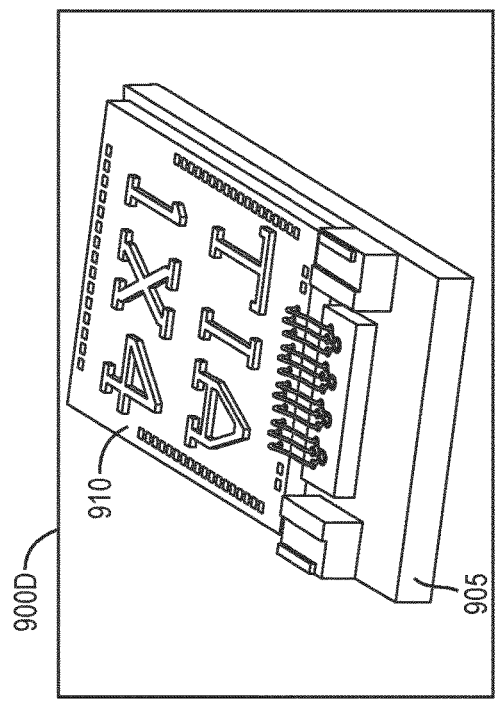

Referring specifically now to FIG. 9D, depicted is a perspective view of the device shown in FIG. 9C, having an attached TIA 910 module. The TIA 910 can be similar to the TIA 110 described herein above in conjunction with FIGS. 1A and 1B. The TIA 910 can be used to detect and amplify the signals from the photodetectors 920, such that the signals can be detected by other, less-sensitive communications components. In some embodiments, the TIA 910 can be a current to voltage converter, and can include one or more operational amplifies. The TIA 910 can be manufactured, for example, using one or more photolithographic techniques. In some embodiments, the TIA 910 can be a separate module that is coupled to the carrier 905 using a pick-and-place process. The TIA 910 can include one or more conductive pads that are electrically coupled to the electronic components of the TIA 910. In some embodiments, the number of the conductive pads can correspond to a number of the photodetectors positioned on the carrier 905. The TIA can be bonded to the carrier after positioning using one or more bonding techniques, such as thermal conductive bonding, solder bonding, thermosonic bonding, or epoxy-based bonding.

Figure 9F:
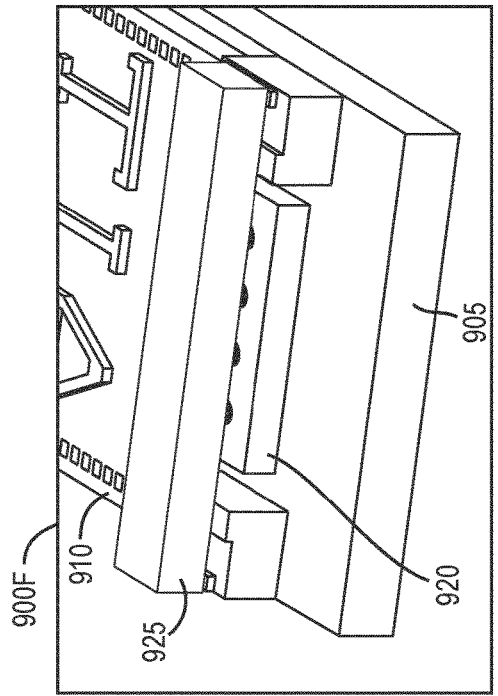
Figure 9E:
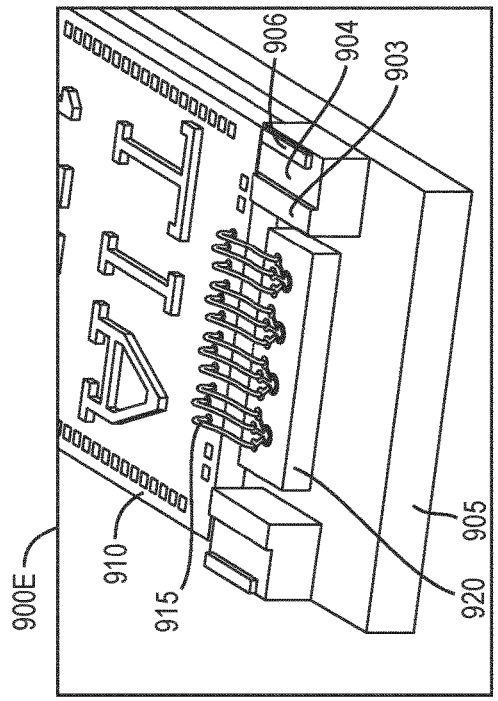

Referring specifically now to FIG. 9E, depicted is a perspective view 900E of the device shown in FIGS. 9A-9D following the next stage in the manufacturing process. As shown, the conductive pads of the TIA 910 can be electrically coupled to the detector 920 using the bonding wires 915, which can be similar to the bonding wires 120 described herein in conjunction with FIGS. 1A and 1B. The bonding wires 915 can be attached such that the wedge are positioned on the photodetector side, thereby minimizing wire loop height and improving overall performance. Also at this stage in the manufacturing process, an epoxy layer 906 has been applied to the surface 904 in the guide posts of the carrier, which will be used to attach the lens substrate in the next manufacturing step. Surface 904 is recessed from surface 903. However, the surface of the epoxy layer 906 is above surface 903.

Referring specifically now to FIG. 9F, depicted is a perspective view of the device shown in FIGS. 9A-9E following the next stage in the manufacturing process. As shown, the lens substrate 925 has been attached to the guide posts on the carrier 905. When the epoxy layer 906 cures, it pulls the bottom of the lens to the guide post. Because the photodetector was positioned relative to the top of the guide posts by the pick-and-place tool 805 having the end 810 with a predetermined step height, the aperture surface of the photodetector 920 can be a desired distance from the bottom of the lens substrate 925, thereby improving focus and performance. This can provide a tight z-tolerance between the lens and each photodetector 920 aperture. The lens substrate 925 can be similar to the lens substrates described herein, and can be cut, divided, etched, or otherwise manufactured to fit on the guide posts and be aligned with each of the photodetectors 920 positioned on the carrier 905. The lens substrate 925 can include a lens for each aperture of the photodetector 920 positioned on the substrate. The lens substrate 925 can be positioned on the carrier, for example, using one or more pick-and-place techniques.

Figure 10:
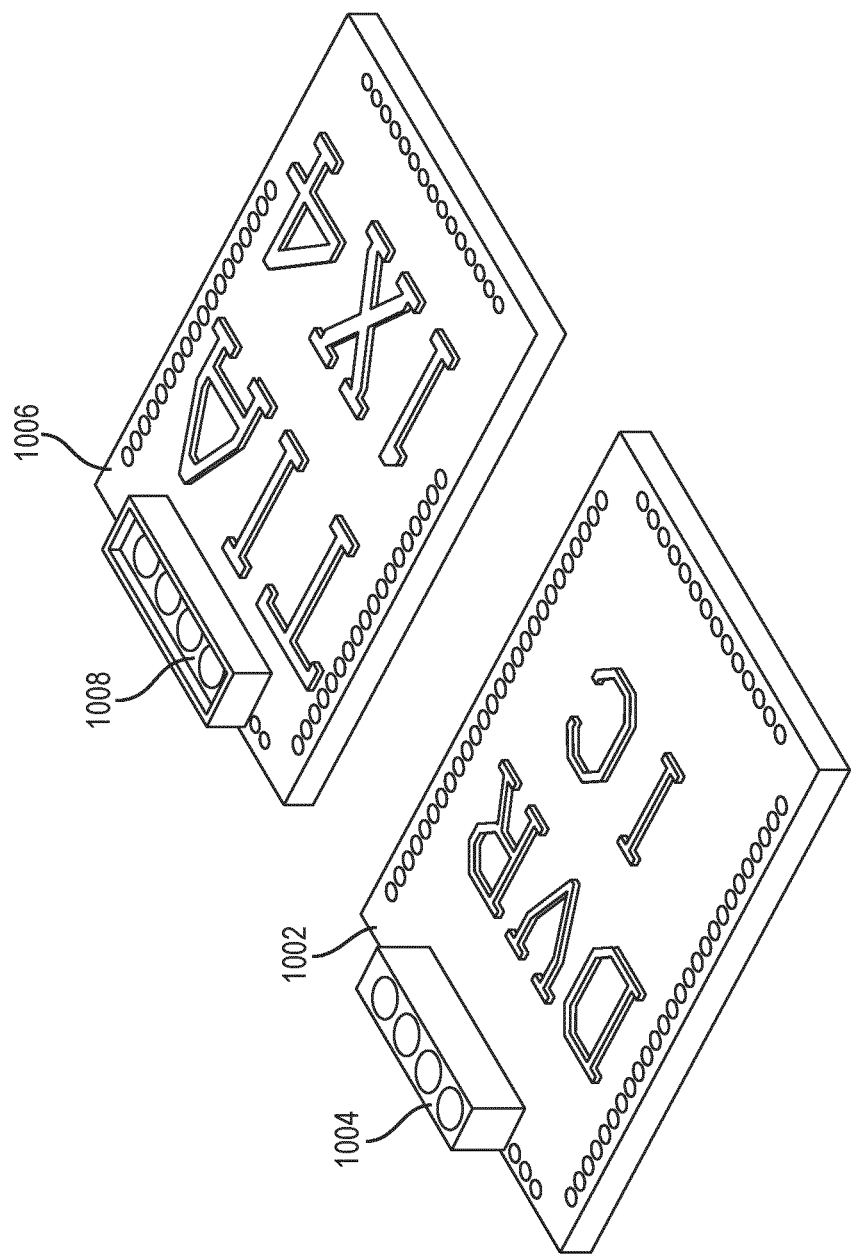
FIG. 10 is a schematic perspective view drawings of optical devices according to some embodiments.

With reference to FIG. 10, an optical device 1004 (e.g., a photodetector and lens assembly or light emitter and lens assembly) is disposed directly on an integrated circuit 1002 and an optical device 1008 (e.g., a photodetector and lens assembly) is provided on a TIA integrated circuit 1006. Optical device 1004 is bonded directly to integrated circuit 1002 by a thermosonic bond in some embodiments. Optical device 1008 is bonded directly to integrated circuit 1006 by a thermosonic bond in some embodiments. Contacts at the bottom of optical devices 1008 and 1004 are used to electrically couple devices 1008 and 1004 to integrated circuits 1006 and 1002, respectively. Flip chip techniques can be used to make the connections. The optical devices can be coupled to a circuit board (e.g., a package substrate circuit board) in some embodiments. Wafer to wafer bonding can be done by thermal compression in some embodiments. Chip to chip connection with bumps are done by thermosonic bonding in some embodiments. Thermosonic bonding uses pressure, temperature, and ultrasonic energy to provide a good bond in a short time in some embodiments.

It should be noted that certain passages of this disclosure may reference terms such as "first" and "second" in connection with devices, mode of operation, transmit chains, antennas, etc., for purposes of identifying or differentiating one from another or from others. These terms are not intended to merely relate entities (e.g., a first device and a second device) temporally or according to a sequence, although in some cases, these entities may include such a relationship. Nor do these terms limit the number of possible entities (e.g., devices) that may operate within a system or environment.

While the foregoing written description of the methods and systems enables one of ordinary skill to make and use what is considered presently to be the best mode thereof, those of ordinary skill will understand and appreciate the existence of variations, combinations, and equivalents of the specific embodiment, method, and examples herein. The present methods and systems should therefore not be limited by the above described embodiments, methods, and examples, but by all embodiments and methods within the scope and spirit of the disclosure.

Having now described some illustrative embodiments and embodiments, it is apparent that the foregoing is illustrative and not limiting, having been presented by way of example. In particular, although many of the examples presented herein involve specific combinations of method acts or system elements, those acts and those elements can be combined in other ways to accomplish the same objectives. Acts, elements and features discussed only in connection with one implementation are not intended to be excluded from a similar role in other embodiments or embodiments.

The phraseology and terminology used herein is for the purpose of description and should not be regarded as limiting. The use of "including" "comprising" "having" "containing" "involving" "characterized by" "characterized in that" and variations thereof herein, is meant to encompass the items listed thereafter, equivalents thereof, and additional items, as well as alternate embodiments consisting of the items listed thereafter exclusively. In one implementation, the systems and methods described herein consist of one, each combination of more than one, or all of the described elements, acts, or components.

Any references to embodiments or elements or acts of the systems and methods herein referred to in the singular can also embrace embodiments including a plurality of these elements, and any references in plural to any implementation or element or act herein can also embrace embodiments including only a single element. References in the singular or plural form are not intended to limit the presently disclosed systems or methods, their components, acts, or elements to single or plural configurations. References to any act or element being based on any information, act or element can include embodiments where the act or element is based at least in part on any information, act, or element.

Any implementation disclosed herein can be combined with any other implementation, and references to "an implementation," "some embodiments," "an alternate implementation," "various implementation," "one implementation" or the like are not necessarily mutually exclusive and are intended to indicate that a particular feature, structure, or characteristic described in connection with the implementation can be included in at least one implementation. Such terms as used herein are not necessarily all referring to the same implementation. Any implementation can be combined with any other implementation, inclusively or exclusively, in any manner consistent with the aspects and embodiments disclosed herein.

References to "or" can be construed as inclusive so that any terms described using "or" can indicate any of a single, more than one, and all of the described terms.

Where technical features in the drawings, detailed description or any claim are followed by reference signs, the reference signs have been included for the sole purpose of increasing the intelligibility of the drawings, detailed description, and claims. Accordingly, neither the reference signs nor their absence have any limiting effect on the scope of any claim elements.

The systems and methods described herein can be embodied in other specific forms without departing from the characteristics thereof. Although the examples provided can be useful for applying a microlens to a small aperture photodetector device, or to a VCSEL device, for High Data Rate Applications, the systems and methods described herein can be applied to other environments and applications. The foregoing embodiments are illustrative rather than limiting of the described systems and methods. The scope of the systems and methods described herein can thus be indicated by the appended claims, rather than the foregoing description, and changes that come within the meaning and range of equivalency of the claims are embraced therein.

We claim:

1. An apparatus, comprising:
a lens comprising a first lens surface and a second lens surface opposite the first lens surface, the second lens surface comprising a first metal pad; and
a device layer comprising an optical device, a first device surface and a second device surface opposite the first device surface, wherein the first device surface is coupled to the second lens surface, wherein a portion of the device layer is removed at the second device surface to expose a second metal layer surface of a first metal layer at the first device surface, the first metal pad being attached to a first metal surface of the first metal layer at the first device surface, the second metal layer surface being opposite the first metal layer surface, wherein the second device surface includes a second pad on an unremoved portion of the device layer at the second device surface, wherein the second metal layer surface is intermediate the first metal layer surface and the second device surface.

2. The apparatus of claim 1, wherein the optical device is a vertical cavity surface emitting laser or a photodetector.

3. The apparatus of claim 1, wherein the optical device is disposed on an epitaxial layer.

4. The apparatus of claim 1, wherein a metal bump is attached to a third device surface.

5. An apparatus, comprising:
a lens comprising a first lens surface and a second lens surface opposite the first lens surface, the second lens surface comprising a first metal pad; and
a device layer comprising an optical device, a first device surface and a second device surface opposite the first device surface, the first device surface comprising a second metal pad, wherein the second metal pad is physically attached to the first metal pad and a third metal pad is provided on the second device surface, wherein the third metal pad is disposed on a first metal layer and wherein a fourth pad is disposed on a second metal layer, the device layer being an epitaxial layer, the second metal layer being exposed through a hole in the epitaxial layer.

6. The apparatus of claim 5 wherein the first metal layer comprises the second metal pad.

7. An optical device assembly, comprising:
a carrier,
a discrete lens attached to the carrier between a plurality of raised portions extending from a first surface of the carrier;
a semiconductor material comprising a top surface comprising at least a portion of an optical device and a bottom surface, the semiconductor material being attached to the first surface at the bottom surface, wherein first metal pads of the top surface of the semiconductor material are coupled with second metal pads on a top surface of the discrete lens; and
wherein a first cathode or anode of a diode disposed on or in the semiconductor material is exposed through the semiconductor material and a second cathode or anode of the diode is disposed on the bottom surface.

8. An optical device assembly of claim 7, wherein the lens has an index of refraction greater than 2.

9. An optical device assembly of claim 7, wherein the first surface is attached to the bottom surface by an epoxy and gold bumps on the first surface maintain a position of the semiconductor material when the epoxy is cured.

10. An optical device assembly of claim 7, wherein the lens is attached to the raised portions using epoxy and curing the epoxy draws the lens toward the semiconductor material.

11. An optical device assembly, comprising:
a lens substrate coupled to an optical device substrate having a first surface comprising at least a portion of one or more optical devices, the first surface being in contact with a second surface of the lens substrate; and
wherein a portion of the optical device substrate is removed to expose a conductive layer, the conductive layer being on a third surface of the optical device substrate after removing the portion, wherein the optical device substrate includes a pad on fourth surface on an unremoved portion the optical device substrate, the fourth surface being opposite the first surface, wherein the third surface is intermediate the first surface and the fourth surface.

12. The optical device assembly of claim 11, wherein optical device assembly is a vertical cavity surface emitting laser or a photodetector.

13. The optical device assembly of claim 11, wherein exposed metal pads are disposed on the conductive layer.

14. The optical device assembly of claim 11, wherein the optical device substrate comprises an epitaxial layer above a bulk substrate.

15. The optical device assembly of claim 14, wherein the bulk substrate comprises a semiconductor on glass material.

16. An optical device assembly, comprising:
a lens substrate coupled to an optical device substrate having a first surface comprising at least a portion of one or more optical devices, the first surface being in contact with a second surface of the lens substrate; and
wherein a portion of the optical device substrate is removed to expose a conductive layer, the conductive layer being on a third surface of the optical device substrate opposite the first surface of the optical device substrate after removing the portion, wherein the optical device substrate comprises an epitaxial layer above an etch stop layer above a bulk substrate and wherein removing the portion comprises etching to the etch stop layer, the etch stop layer being adjacent the conductive layer.

17. An optical device assembly, comprising:
an optical device substrate;
a lens substrate; and
first metal pads of the lens substrate aligned with second metal pads of the optical device substrate having a first surface, the optical device substrate comprising at least a portion of one or more optical devices;
wherein the first metal pads of the lens substrate are coupled with the second metal pads on the first surface of the optical device substrate; and
wherein a first cathode or anode of a diode disposed on the first surface is exposed through the optical device substrate and a second cathode or anode of the diode is disposed on a second surface opposite the first surface.

18. The optical device assembly of claim 17 wherein the one or more optical devices is a vertical cavity surface emitting laser or a photodetector.

19. The optical device assembly of claim 17, wherein the optical device substrate comprises an epitaxial layer comprising at least the portion of one or more optical devices, the epitaxial layer being between the first surface and the second surface.

20. The optical device assembly of claim 19, further comprising:
contact material on the first cathode or anode.

21. The optical device assembly of claim 20, wherein the contact material comprises gold bumps.

22. The optical device assembly of claim 21, wherein the gold bumps are coupled to a circuit board or an integrated circuit die using a flip chip technique.

23. An optical device assembly, comprising:
an optical device substrate;
a lens substrate; and
first metal pads of the lens substrate aligned with second metal pads of the optical device substrate having a first surface comprising at least a portion of one or more optical devices;
wherein the first metal pads of the lens substrate are coupled with the second metal pads on the first surface of the optical device substrate; and
wherein a portion of the optical device substrate is removed to expose a conductive layer, the conductive layer being on a second surface opposite the first surface after removing the portion; and
an etch stop layer adjacent an epitaxial layer associated with the optical device substrate.

24. The optical device assembly of claim 23, wherein the epitaxial layer comprises the one or more optical devices.

* * * * *